United States Patent [19]
Yunogami et al.

[11] Patent Number: 6,057,081
[45] Date of Patent: May 2, 2000

[54] PROCESS FOR MANUFACTURING SEMICONDUCTOR INTEGRATED CIRCUIT DEVICE

[75] Inventors: Takashi Yunogami, Niiza; Shunji Sasabe, Iruma; Kazuyuki Suko, Hachioji; Jun Abe, Tachikawa; Takao Kumihashi, Musashino; Fumio Murai, Hinode-machi, all of Japan

[73] Assignee: Hitachi, Ltd., Tokyo, Japan

[21] Appl. No.: 08/935,033

[22] Filed: Sep. 22, 1997

[30]      Foreign Application Priority Data

Sep. 20, 1996  [JP]  Japan ................................... 8-250749

[51] Int. Cl.⁷ ...................................................... G03F 7/26
[52] U.S. Cl. .......................... 430/313; 430/330; 430/328; 216/41; 216/67; 438/713
[58] Field of Search ..................................... 430/314, 313, 430/317, 328, 330; 216/67, 41, 6; 438/710, 713

[56]                References Cited

U.S. PATENT DOCUMENTS

| | | | |
|---|---|---|---|
| 4,678,540 | 7/1987 | Uchimura | 156/643 |
| 4,705,597 | 11/1987 | Gimpleson et al. | 156/643 |
| 4,838,992 | 6/1989 | Abraham | 156/643 |
| 5,174,857 | 12/1992 | Sung | 156/643 |
| 5,258,093 | 11/1993 | Maniar | 156/626 |
| 5,453,347 | 9/1995 | Bullington et al. | 430/315 |
| 5,509,995 | 4/1996 | Park | 156/643.1 |
| 5,515,984 | 5/1996 | Yokoyama et al. | 216/41 |
| 5,516,626 | 5/1996 | Ohmi et al. | 430/328 |
| 5,651,856 | 7/1997 | Keller et al. | 156/643.1 |
| 5,685,950 | 11/1997 | Sato | 156/643.1 |
| 5,686,363 | 11/1997 | Tabara | 437/233 |
| 5,691,111 | 11/1997 | Iwasa et al. | 430/270.1 |
| 5,695,906 | 12/1997 | Nishi et al. | 430/190 |
| 5,700,607 | 12/1997 | Rath et al. | 430/15 |
| 5,726,102 | 3/1998 | Lo | 438/718 |
| 5,753,418 | 5/1998 | Tsai et al. | 430/313 |
| 5,756,262 | 5/1998 | Endo et al. | 430/313 |
| 5,789,323 | 8/1998 | Taylor | 438/706 |
| 5,795,832 | 8/1998 | Kumihashi et al. | 438/714 |
| 5,805,273 | 9/1998 | Unno | 355/30 |
| 5,840,200 | 11/1998 | Nakagawa et al. | 216/6 |

FOREIGN PATENT DOCUMENTS 5-89662  4/1993  Japan .

OTHER PUBLICATIONS

27p–N–9, Preprint No. 2 of the 43rd Joint Congress of Applied Physics of Japan 1996. "Pt/PZT/pt Capacitor Fabrication Using Self–Cleaning Dry Etching", by T. Kumihashi, et al.

26a–ZT–4, Preprint No. 2 of 56th Joint Congress of Applied Physics of Japan 1995. Dry Etching of Platinum with $Ar/O_2$ Gas Plasma by M. Matsushita, et al.

"Glow Discharge Processes Sputtering and Plasma Etching", by Brian Chapman, pp/244–253.

Yunogami, et al., "Sub–Quarter–Micron Pt Etching Technology Using Electron Beam Resist with Round–Head", (Received Jul. 14, 1998).

Yunogami, et al., "Sidewall–Fence–Free Pt Etching Using Round Head Resist Mask by Magnetron–RIE", in 1997 Dry Process Symposium, pp. 211–216.

*Primary Examiner*—Kathleen Duda
*Attorney, Agent, or Firm*—Antonelli, Terry, Stout & Kraus, LLP

[57]               ABSTRACT

In order that reaction products of low vapor pressure may be prevented from being deposited on the side wall of a predetermined pattern when this pattern is to be formed by dry-etching a Pt film or a PZT film, a resist mask 54 having a rounded outer periphery at its head is used when the Pt film 53 deposited on a semiconductor substrate 50 is to be dry-etched. After this dry-etching, moreover, an overetching of a proper extent is performed to completely remove the side wall deposited film 55 which is left on the side of the pattern. The resist mask 54 is formed by exposing and developing a benzophenone novolak resist and subsequently by heating to set it while irradiating it, if necessary, with ultraviolet rays.

60 Claims, 34 Drawing Sheets

FIG. 8

| ADDITIONAL BAKING TEMPERATURE | (a) NO ADDITIONAL BAKE | (b) 150°C | (c) 175°C | (d) 190°C |
|---|---|---|---|---|
| BEFORE ETCHING | RESIST ~90°, Pt, TAPER ANGLE ~90° | RESIST 80°, Pt, TAPER ANGLE ~80° | ~75°, 90°, Pt, TAPER ANGLE AT THE TOP ~75° RESIST ROOT ~90° | 45°, 90°, Pt |
| AFTER OVERETCHING | FILM DEPOSITED TO SIDE WALL, Pt, SIDE WALL FILM DEPOSITION | FILM DEPOSITED TO SIDE WALL, Pt, SIDE WALL FILM DEPOSITION | Pt, NO SIDE WALL FILM DEPOSITION | Pt, NO SIDE WALL FILM DEPOSITION |
| CHARACTERISTICS | FOR TAPER ANGLE OF NEAR 90°, THERE IS NO SIDE WALL FILM DEPOSITION, AND ETCHING IS IMPOSSIBLE. | FOR OVERALL TAPER ANGLE OF 80°, THERE IS NO SIDE WALL FILM DEPOSITION, AND ETCHING IS IMPOSSIBLE. | TAPER ANGLE IS ABOUT 75° AT THE TOP OF THE RESIST, AND ABOUT 90° AT THE ROOT. NO FILM DEPOSITED TO THE SIDE WALL. THE REASON WHY THE ETCHING WAS POSSIBLE IS THAT THE TAPER ANGLE AT THE TOP WAS ADEQUATE. | THE TAPER ANGLE AT THE ROOT OF THE RESIST IS ABOUT 90°, BUT THE ETCHING WAS PERFORMED WITH NO FILM DEPOSITED TO THE SIDE WALL BECAUSE THE TOP IS ROUND. |

FIG. 10

| RESIST | UV CONDITIONS | | STATE OF SIDE WALL FILM DEPOSITION (○: NO FILM DEPOSITION, △: LITTLE FILM DEPOSITION, ×: DEPOSITION) | | | | | | | | | |
|---|---|---|---|---|---|---|---|---|---|---|---|---|
| | TEMPERATURE T°C | TIME t SECONDS | 1 | 2 | 3 | 4 | 5 | 6 | 7 | 8 | 9 | 10 |
| 9200B2 | 140 | 15 | × | × | × | × | △ | ○ | △ | × | × | × |
| | 180 | 15 | × | × | △ | △ | △ | ○ | △ | × | × | × |
| | 180 | 30 | × | △ | △ | △ | ○ | ○ | △ | × | × | × |
| | 180 | 60 | × | △ | △ | △ | ○ | ○ | ○ | × | × | × |
| | 200 | 15 | × | △ | △ | ○ | ○ | ○ | ○ | ○ | × | × |
| | 220 | 15 | × | △ | ○ | ○ | ○ | ○ | ○ | ○ | △ | × |
| CR-N2 | 180 | 15 | × | × | × | × | × | × | × | × | × | × |
| | 180 | 30 | × | × | × | × | △ | △ | × | × | × | × |
| | 180 | 60 | × | × | × | × | △ | × | × | × | × | × |
| | 200 | 15 | × | × | × | × | △ | × | × | × | × | × |
| | 200 | 15 | × | × | × | × | △ | × | × | × | × | × |

FIG. 39

RELATIONS BETWEEN FOCUS CONTROL AND RESIST SECTIONAL SHAPE

| FOCUS OFFSET ($\mu$m) | TSMR CR-N2 NON-BENZOPHENONE NOVOLAK RESIST | | TSMR 9200-B2 BENZOPHENONE NOVOLAK RESIST | |
|---|---|---|---|---|
| | SECTION | TAPER ANGLE | SECTION | TAPER ANGLE |
| −2.0 | | ~60° | | ~60° |
| −1.5 | | ~75° | | ~67° |
| −0.5 | | ~85° | | ~78° |
| ±0 BEST FOCUS | | ~87° | | ~85° |
| +1.0 | | ~87° | | ~85° |
| +2.0 | | ~85° | | ~79° |

DEEP UV IRRADIATION

BAKE   APPLY ACIDIC POLYMER

PROCESS FOR MANUFACTURING SEMICONDUCTOR INTEGRATED CIRCUIT DEVICE

BACKGROUND OF THE INVENTION

The present invention relates to a process for manufacturing a semiconductor integrated circuit device having a ferroelectric (high relative dielectric constant substance) capacitor and, more particularly, to a technique which is effective when applied to a process for manufacturing a ferroelectric (high relative dielectric constant substance) capacitor by using a conductive material for producing reaction products of low vapor pressure at a dry-etching time.

In order to compensate the reduction in the amount of stored charge with the miniaturization of the memory cell of a large capacity DRAM (Dynamic Random Access Memory) exceeding 256 Mbits or 1 Gbits, it is demanded that the capacitor insulating film of a data storing capacitive element (or capacitor) is made of a high relative dielectric material having a specific relative dielectric constant of 20 or more such as $Ta_2O_5$ or BST $((Ba, Sr)TiO_3)$, or a ferroelectric material having a relative dielectric constant over 100 such as PZT $(PbZr_xT_{1-x}O_3)$, PLT $(PbLa_xTi_{1-x}O_3)$, PLZT, $PbTiO_3$, $SrTiO_3$ or $BaTiO_3$.

In the field of a nonvolatile memory, there has been developed a ferroelectric memory which utilizes the polarization inversion of the ferroelectric material for data storage.

When the capacitor insulating film of the capacitor is made of an aforementioned ferroelectric substance (high relative dielectric constant substance), it is necessary to make the conductive films for electrodes sandwiching the capacitor insulating film, of such a refractory metallic material, e.g., Pt having a high affinity with those materials.

When the capacitor is made of Pt or PZT, there arises the following problem. When the thin film of Pt or PZT deposited on the substrate is dry-etched, it is known that a lot of reaction products having a low vapor pressure are deposited on the side face of a pattern to cause the short-circuiting between the capacitors.

In order to prevent reaction products from being deposited on the side face of the pattern when the Pt film is to be dry-etched, there is known in the prior art either a method of tapering the side face of a photoresist used as the etching mask or a method of using a hard mask of a silicon oxide film or a metal film in place of the photoresist.

It has been reported in 27p-N-9, Preprint No. 2 of the 43rd Joint Congress of Applied Physics of Japan 1996, that a clean capacitor without any side wall deposited film can be formed by using a resist mask having a side face tapered at about 75 degrees when a three-layered film of Pt/PZT/Pt deposited on a substrate is dry-etched. This can be thought in the following manner. If the side face of the resist mask is tapered, the side face of the pattern is also irradiated with etching ions so that the etch-off rate is enabled to exceed the deposition rate of the side wall deposited film by increasing the taper angle over a predetermined value (e.g., about 75 degrees).

It has been reported in 26a-ZT-4, Preprint No. 2 of 56th Joint Congress of Applied Physics of Japan 1995, that the Pt film can be tapered to effect the etching without any side wall deposited film, when the Pt film is dry-etched, by using as the mask a silicon oxide film etched to a predetermined pattern and by using an etching gas containing Ar and additional oxygen.

Japanese Patent Laid-Open No. 89662/1993 has disclosed a method of forming an excellent Pt pattern having no side wall deposited film by using as the mask a Ti film etched to a predetermined pattern thereby to etch the Pt film.

The RIE etching technique using a tapered resist mask has been disclosed on pp. 244 to 253, "Glow Discharge Processes SPUTTERING AND PLASMA ETCHING", by Brian Chapman.

SUMMARY OF THE INVENTION

According to our investigations, however, the prior art method of patterning the Pt film by using the resist mask having the tapered side face has problems of not only a complicated step of tapering the side face of the resist mask but also a difficulty in forming a fine Pt pattern in a high sizing accuracy.

On the other hand, the method of using the hard mask of the silicon oxide film or the metallic film forms a hard mask pattern by dry-etching such a film deposited on the Pt film, and has a problem of an increase in the steps, compared to the case of using the resist mask. During the etching, moreover, the hard mask has to be heated to as high as 300° C. to raise other problems that when the Pt film over the ferroelectric (high relative dielectric constant substance) film is etched, the underlying ferroelectric (high relative dielectric constant substance) film is deteriorated, and that the hard mask is difficult to ash off after the end of the etching.

An object of the present invention is to provide a technique which can form a fine pattern, when a thin film of Pt or the like deposited on a substrate is patterned by a dry-etching method using a resist mask, without leaving reaction products of low vapor pressure on the side face of the pattern and in a high dimensional accuracy.

The aforementioned and other objects and novel features of the present invention will become apparent from the following description to be made with reference to the accompanying drawings.

The summaries of the invention will be briefly described in the following.

(1) According to the present invention, there is provided a process for manufacturing a semiconductor integrated circuit device, comprising the step of patterning by a dry-etching method a thin film, which has one or a plurality of films including a film formed directly or indirectly over a first major surface of a wafer and liable to be deposited on a side wall, by using as the mask a photoresist film of a predetermined pattern, which has a generally vertical side face of at least its lower half and which is either normally tapered or rounded at the outer periphery of its head, so that the side face of the thin film pattern may be normally tapered so as to reach the lower end thereof.

(2) The thin film pattern is overetched, after having been formed, to remove the side wall deposited film which is left on the side face of the thin film pattern.

(3) The thin film includes a platinum thin film.

(4) The thin film includes a high relative dielectric constant thin film or a ferroelectric thin film.

(5) According to the present invention, there is provided a process for manufacturing a semiconductor integrated circuit device, comprising:

(a) the step of forming a thin film, which has one or a plurality of films including a film liable to be deposited on a side wall, directly or indirectly over a first major surface of a wafer;

(b) the step of forming a photoresist of a predetermined pattern, which has a generally vertical side face of at least its lower half and which is either normally tapered or rounded at the outer periphery of its head, directly or indirectly over the thin film; and (c) the step of patterning by a dry-etching method the thin film by using as the mask the photoresist film of the predetermined pattern so that the side face of the thin film pattern may be normally tapered so as to reach the lower end thereof.

(6) The thin film pattern is overetched, after having been formed, to remove the side wall deposited film which is left on the side face of the thin film pattern.

(7) The thin film includes a platinum thin film.

(8) The thin film includes a high relative dielectric constant thin film or a ferroelectric thin film.

(9) According to the present invention, there is provided a semiconductor integrated circuit device manufacturing process, comprising:

(a) the step of forming a thin film, which has one or a plurality of films including a film liable to be deposited on a side wall, directly or indirectly over a first major surface of a wafer;

(b) the step of forming a positive type benzophenone novolak resist film by spin-coating over the thin film;

(c) the step of forming a predetermined resist film pattern by exposing and developing the positive type benzophenone novolak resist film;

(d) the step of setting the resist film pattern by heating at least the resist film pattern and by irradiating the surface of the same with ultraviolet radiation;

(e) the step of patterning by a dry-etching method the thin film by using as the mask the set photoresist film pattern so that the side face of the thin film pattern may be normally tapered so as to reach the lower end thereof; and (f) overetching the thin film pattern, after having been formed, to remove the side wall deposited film which is left on the side face of the thin film pattern, wherein at the end of the step (d), the surface insolubilization of the unexposed portion is weakened at the developing time of the positive type benzophenone novolak resist film so that the outer periphery of the head of the resist film pattern may be rounded.

(10) The thin film includes a platinum thin film.

(11) The thin film includes a high-dielectric thin film or a ferroelectric thin film.

(12) According to the present invention, there is provided a process for manufacturing a semiconductor integrated circuit device by repeating a photolithography processing by a reduction projection exposure using a positive or negative type photoresist and an exposure light of substantially the same wavelengths, to pattern a plurality of thin films, wherein a first photoresist of the positive or negative type is used at a portion of the step for the photolithography processing whereas a second photoresist having the same positive or negative type as that of the first photoresist but a different pattern shape and characteristic is used at the other portion of the step or at all the other steps.

(13) The first photoresist is a positive type benzophenone novolak resist whereas the second photoresist is a positive type non-benzophenone novolak resist.

(14) The semiconductor integrated circuit device manufacturing process of the present invention comprises the step of patterning the thin film having one or a plurality of films including a film liable to be deposited on the side wall, by using as the mask a resist pattern made of the first photoresist.

(15) The semiconductor integrated circuit device manufacturing process of the present invention comprises the step of overetching the thin film pattern, after having been formed, to remove the side wall deposited film which is left on the side face of the thin film pattern.

(16) According to the present invention, there is provided a process for manufacturing a semiconductor integrated circuit device, comprising:

(a) the step of forming a first thin film having one or a plurality of films directly or indirectly over a first major surface of a wafer;

(b) the step of forming a first photoresist film made of a positive type benzophenone novolak resist directly or indirectly over the first thin film;

(c) the step of forming a first resist film pattern over the first thin film by exposing the first photoresist film by a reduction projection exposure processing and subsequently by developing the exposed first photoresist film;

(d) the step of forming a gate electrode of a MISFET over the first major surface of the wafer by patterning the first thin film by a dry-etching method using as the mask the first resist film;

(e) the step of forming a second thin film having one or a plurality of films including a film, which is liable to be deposited on the side wall at the dry-etching time, directly or indirectly over the first major surface of the wafer formed with the gate electrode;

(f) the step of forming a second photoresist film made of a positive type benzophenone novolak resist by spin-coating over the second thin film;

(g) the step of forming a second resist film pattern over the second thin film by exposing the second photoresist film by a reduction projection exposure processing and subsequently by developing the exposed second photoresist film;

(h) the step of patterning the second thin film by a dry-etching method using as the mask the second resist film so that the side face of the thin film pattern may be normally tapered as to reach the lower end thereof; and (i) overetching the thin film pattern, after having been formed, to remove the side wall deposited film which is left on the side face of the thin film pattern.

(17) The second thin film is a thin film forming a capacitor of the memory cell of a DRAM.

(18) The second thin film is a thin film forming a capacitor of the memory cell of a ferroelectric RAM.

(19) The second thin film includes a thin film made of one or more metals or conductive metal oxides selected from the group consisting of Pt, Ir, $IrO_2$, Rh, $RhO_2$, Os, $OsO_2$, Ru, $RuO_2$ Re, $ReO_3$, Pd and Au.

(20) The second thin film includes a thin film made of one or more ferroelectric substances selected from the group consisting of PZT, PLT, PLZT, SBT, $PbTiO_3$, $SrTiO_3$ and $BaTiO_3$.

(21) According to the present invention, there is provided a process for manufacturing a semiconductor integrated circuit device, comprising:

(a) the step of forming a first thin film having one or a plurality of films directly or indirectly over a first major surface of a wafer;

(b) the step of forming a positive type first photoresist film having a square sectional shape at the upper end or upper half of the pattern side face directly or indirectly over the first thin film;

(c) the step of forming a first resist film pattern over the first thin film by exposing the first photoresist film by a reduction projection exposure processing and subsequently by developing the exposed first photoresist film;

(d) the step of forming a gate electrode of a MISFET over the first major surface of the wafer by patterning the first thin film by a dry-etching method using as the mask the first resist film;

(e) the step of forming a second thin film having one or a plurality of films directly or indirectly over the first major surface of the wafer formed with the gate electrode;

(f) the step of forming a positive type second photoresist film having a less square sectional shape than that of the first photoresist film at the upper end or upper half of the pattern side face directly or indirectly by spin-coating over the second thin film;

(g) the step of forming a second resist film pattern over the second thin film by exposing the second photoresist film by a reduction projection exposure processing and subsequently by developing the exposed second photoresist film;

(h) the step of patterning the second thin film by a dry-etching method using as the mask the second resist film so that the side face of the thin film pattern may be normally tapered so as to reach the lower end thereof; and (i) the step of overetching the thin film pattern, after having been formed, to remove the side wall deposited film which is left on the side face of the thin film pattern.

(22) According to the present invention, there is provided a process for manufacturing a semiconductor integrated circuit device, comprising:
 (a) the step of forming a first thin film having one or a plurality of films directly or indirectly over a first major surface of a wafer;
 (b) the step of forming a first photoresist film having a square sectional shape at the upper end or upper half of the pattern side face directly or indirectly over the first thin film;
 (c) the step of forming a first resist film pattern over the first thin film by exposing the first photoresist film by a reduction projection exposure processing and subsequently by developing the exposed first photoresist film;
 (d) the step of forming a gate electrode of a MISFET over the first major surface of the wafer by patterning the first thin film by a dry-etching method using as the mask the first resist film;
 (e) the step of forming a second thin film including a conductive film having one or a plurality of films directly or indirectly over the first major surface of the wafer formed with the gate electrode;
 (f) the step of forming a second photoresist film having a less square sectional shape than that of the first photoresist film at the upper end or upper half of the pattern side face directly or indirectly over the second thin film;
 (g) the step of forming a second resist film pattern over the second thin film by exposing the second photoresist film by a reduction projection exposure processing and subsequently by developing the exposed second photoresist film;

(h) the step of patterning the second thin film by a dry-etching method using as the mask the second resist pattern so that the side face of the thin film pattern may be tapered to macroscopically protrude upward and to reach the lower end thereof; and (i) the step of overetching the thin film pattern, after having been formed, to remove the side wall deposited film which is left on the side face of the thin film pattern.

(23) According to the present invention, there is provided a process for manufacturing a semiconductor integrated circuit device, comprising:
 (a) the step of forming a thin film having one or a plurality of films including a film liable to be deposited on the side wall, directly or indirectly over a first major surface of a wafer;
 (b) the step of forming a positive resist film pattern, which has a generally vertical side face of at least its lower half and which is rounded at the outer periphery of its head, directly or indirectly over the thin film;
 (c) the step of patterning by a dry-etching method the thin film by using as the mask by the resist film pattern so that the side face of the thin film pattern may be tapered to macroscopically protrude upward and to reach the lower end thereof and so that the side face of the side wall deposited film deposited on the individual side faces of the resist film pattern and the thin film pattern may be tapered to macroscopically protrude upward and to reach the lower ends thereof; and
 (d) the step of overetching the thin film pattern, after having been formed, to remove the side wall deposited film which is left on the side face of the thin film pattern.

(24) According to the present invention, there is provided a process for manufacturing a semiconductor integrated circuit device, comprising:
 (a) the step of forming a thin film having one or a plurality of films including a film liable to be deposited on the side wall, directly or indirectly over a first major surface of a wafer;
 (b) the step of forming a positive resist film pattern having a generally vertical side face directly or indirectly over the thin film;
 (c) the step of normally tapering the outer periphery of the head of the resist film pattern by baking the resist film pattern;
 (d) the step of patterning by a dry-etching method the thin film by using as the mask the resist film pattern so that the side face of the thin film pattern may be normally tapered so as to reach the lower end thereof and so that the side face of the side wall deposited film deposited on the individual side faces of the resist film pattern and the thin film pattern may be normally tapered so as to reach the lower ends thereof; and
 (e) the step of overetching the thin film pattern, after having been formed, to remove the side wall deposited film which is left on the side face of the thin film pattern.

(25) According to the present invention, there is provided a process for manufacturing a semiconductor integrated circuit device, comprising:
 (a) the step of forming a thin film having one or a plurality of films including a film liable to be deposited on the side wall, directly or indirectly over a first major surface of a wafer;

(b) the step of forming a photoresist film directly or indirectly by spin-coating over the thin film;

(c) the step of forming a predetermined resist film pattern by exposing and developing the photoresist film;

(d) the step of patterning by a dry-etching method the thin film by using as the mask the resist film pattern so that the side face of the thin film pattern may be normally tapered so as to reach the lower end thereof; and (e) the step of overetching the thin film pattern, after having been formed, to remove the side wall deposited film which is left on the side face of the thin film pattern, wherein the outer periphery of the head of the resist film pattern is either normally tapered or rounded by controlling the focusing condition of the exposing beam at the time of exposing the photoresist film.

(26) According to the present invention, there is provided a process for manufacturing a semiconductor integrated circuit device, comprising:

(a) the step of forming a first thin film having one or a plurality of films directly or indirectly over a first major surface of a wafer;

(b) the step of forming a first photoresist film made of a positive type chemically amplified photoresist directly or indirectly over the first thin film;

(c) the step of forming a first resist film pattern over the first thin film by exposing and developing the first photoresist film;

(d) the step of forming a gate electrode of a MISFET over the first major surface of the wafer by patterning the first thin film by a dry-etching method using as the mask by the first resist film;

(e) the step of forming a second thin film having one or a plurality of films including a film liable to be deposited on the side wall at a dry-etching time directly or indirectly over the first major surface of the wafer formed with the gate electrode;

(f) the step of forming a second photoresist film made of a negative type chemically amplified photoresist directly or indirectly over the second thin film;

(g) the step of forming a second resist film pattern having a rounded outer periphery at its head over the second thin film by exposing and developing the second photoresist film; and (h) the step of patterning the second thin film by a dry-etching method using as the mask the second resist film.

(27) According to the present invention, there is provided a process for manufacturing a semiconductor integrated circuit device, comprising:

(a) the step of forming a first thin film having one or a plurality of films directly or indirectly over a first major surface of a wafer;

(b) the step of forming a first photoresist film made of a positive type chemically amplified photoresist directly or indirectly over the first thin film;

(c) the step of forming a first resist film pattern over the first thin film by exposing and developing the first photoresist film;

(d) the step of forming a gate electrode of a MISFET over the first major surface of the wafer by patterning the first thin film by a dry-etching method using as the mask the first resist film;

(e) the step of forming a second thin film having one or a plurality of films including a film liable to be deposited on the side wall at a dry-etching time directly or indirectly over the first major surface of the wafer formed with the gate electrode;

(f) the step of forming a second photoresist film made of a positive type chemically amplified photoresist directly or indirectly over the second thin film;

(g) the step of forming a second resist film pattern over the second thin film by exposing and developing the second photoresist film;

(h) the step of melting only the surface of the second resist film pattern by irradiating the second resist film pattern with ultraviolet radiation;

(i) the step of forming a second resist film pattern having a rounded outer periphery at its head by applying an acidic polymer by spin-coating over the surface of the second resist film pattern melted only at its surface and subsequently by baking the second resist film pattern; and (j) the step of patterning the second thin film by a dry-etching method using as the mask the second resist film.

(28) According to the present invention, there is provided a process for manufacturing a semiconductor integrated circuit device, comprising:

(a) the step of forming a first thin film having one or a plurality of films directly or indirectly over a first major surface of a wafer;

(b) the step of forming a first photoresist film made of a positive type methacrylate photoresist directly or indirectly over the first thin film;

(c) the step of forming a first resist film pattern over the first thin film by exposing and developing the first photoresist film;

(d) the step of forming a gate electrode of a MISFET over the first major surface of the wafer by patterning the first thin film by a dry-etching method using as the mask the first resist film;

(e) the step of forming a second thin film having one or a plurality of films including a film liable to be deposited on the side wall at a dry-etching time directly or indirectly over the first major surface of the wafer formed with the gate electrode;

(f) the step of forming a second photoresist film made of a negative type methacrylate photoresist directly or indirectly by spin-coating over the second thin film;

(g) the step of forming a second resist film pattern having a rounded outer periphery at its head over the second thin film by exposing and developing the second photoresist film; and (h) the step of patterning the second thin film by a dry-etching method using as the mask the second resist film.

(29) According to the present invention, there is provided a semiconductor integrated circuit device manufacturing process, comprising:

(a) the step of forming a thin film, which has one or a plurality of films including a film liable to be deposited on a side wall, directly or indirectly over a first major surface of a wafer;

(b) the step of forming a positive type photoresist film directly or indirectly by spin-coating over the thin film;

(c) the step of forming a predetermined resist film pattern by exposing and developing the photoresist film;

(d) the step of normally tapering the outer periphery of the head of the resist film pattern, by performing a dry-etching for a short time period under the conditions that only the resist film pattern is substantially etched and the etch-off progresses obliquely from the ridge of the head of the resist film pattern;

(e) the step of patterning the thin film by a dry-etching method using as the mask the resist film pattern; and (f) the step of overetching the thin film pattern, after having been formed, to remove the side wall deposited film which is left on the side face of the thin film pattern.

BRIEF DESCRIPTION OF THE DRAWINGS

FIG. 8 is an explanatory diagram illustrating the relations between the shapes of resist masks and the amounts of reaction products deposited on the side faces of Pt patterns;

FIG. 10 is an explanatory diagram illustrating relations between the setting treatments of a resist mask and the amounts of reaction products deposited on the side faces of Pt patterns;

FIG. 39 is an explanatory diagram illustrating the relations between focus controls and resist section shapes of Embodiment 6 of the present invention;

DETAILED DESCRIPTION OF THE INVENTION

Figure 1:
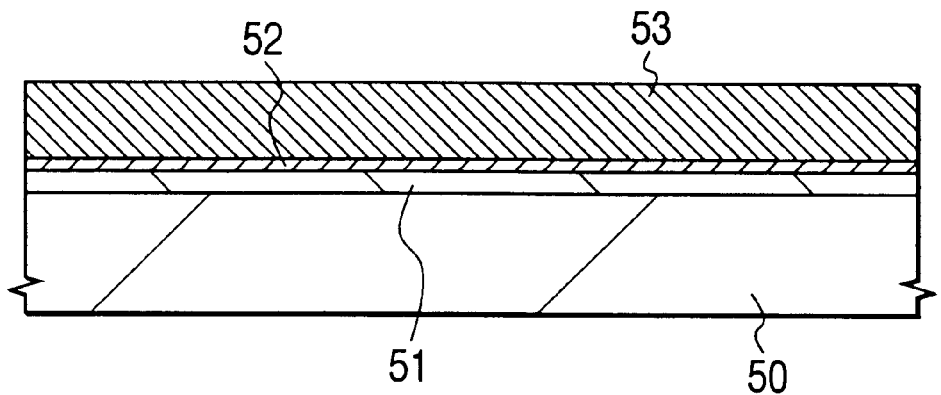
FIG. 1 is a section of an essential portion of a semiconductor substrate and shows a Pt film dry etching method of Embodiment 1 of the present invention.

The present invention will be described in detail in connection with its embodiments with reference to the accompanying drawings. Throughout all the drawings for explaining the embodiments, the portions having identical functions are designated by identical reference numerals, and their repeated description will be omitted.

(Embodiment 1)

A method of dry-etching a Pt film of the present embodiment will be described with reference to FIGS. 1 to 11.

First of all, a silicon oxide film 51 is formed over a semiconductor substrate 50 of single crystal silicon, as shown in FIG. 1. After this, a Ti film 52 having a thickness of 20 nm is deposited as a barrier metal over the silicon oxide film 51 by sputtering. A Pt film 53 having a thickness of 100 nm is deposited over the Ti film 52 by sputtering.

Figure 2:
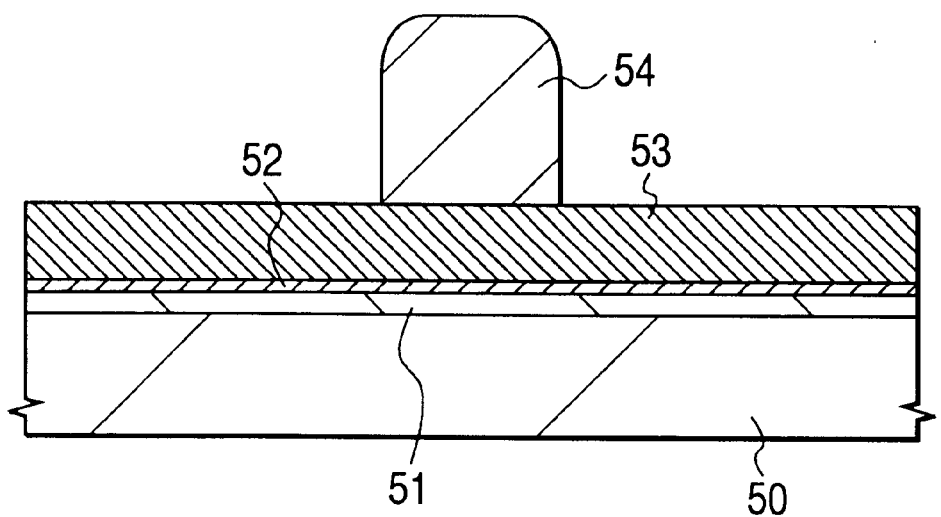
FIG. 2 is a section of an essential portion of a semiconductor substrate and shows a Pt film dry etching method of Embodiment 1 of the present invention.

Next, as shown in FIG. 2, a positive type photoresist formed by spin-coating on the Pt film 53, is exposed to light and developed to form a resist mask 54 which has a generally vertical side shape in at least its lower half and a rounded outer periphery at its head. In order to form the resist mask 54 of such a shape, a positive type resist (such as "TSMR9200-B2" produced by Tokyo Ohka Kogyo Co., Ltd.) benzophenone novolak resist having little insolubilization at the surface of an unexposed portion, i.e., a relatively high solubility of the unexposed portion to the developing liquid is used and subjected to the exposure and development.

Figure 3:
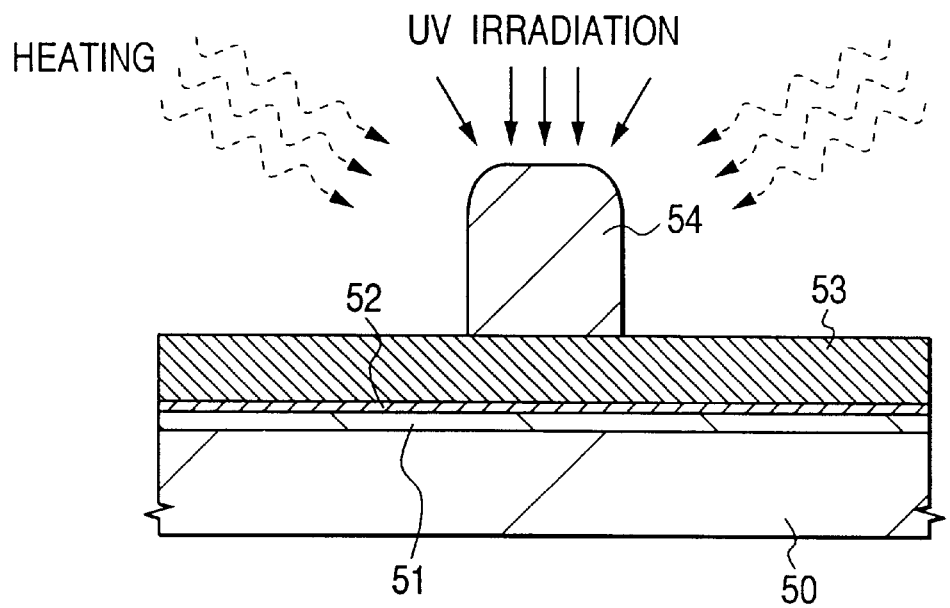
FIG. 3 is a section of an essential portion of a semiconductor substrate and shows a Pt film dry etching method of Embodiment 1 of the present invention.

Next, the resist mask 54 is subjected to a heating treatment of about 200° C. while being irradiated with ultraviolet radiation, as shown in FIG. 3. By this treatment, the crosslinking reaction of macromolecules forming the resist are promoted to increase the degree of polymerization so that the resist mask 54 is set.

Next, the magnetron RIE etcher is used to dry-etch the Pt film 53 and the underlying Ti film 52. The effective etching conditions at this time are a high vacuum, a high power and a high chlorine flow rate, for example, the degree of vacuum in the chamber =5 mTorr, the EF bias =1,200 W (13.56 MHz), the chlorine gas flow rate =40 sccm, and the Ar gas flow rate =10 sccm. The high vacuum in the chamber is effective in evaporating the reaction products promptly.

Figure 4:
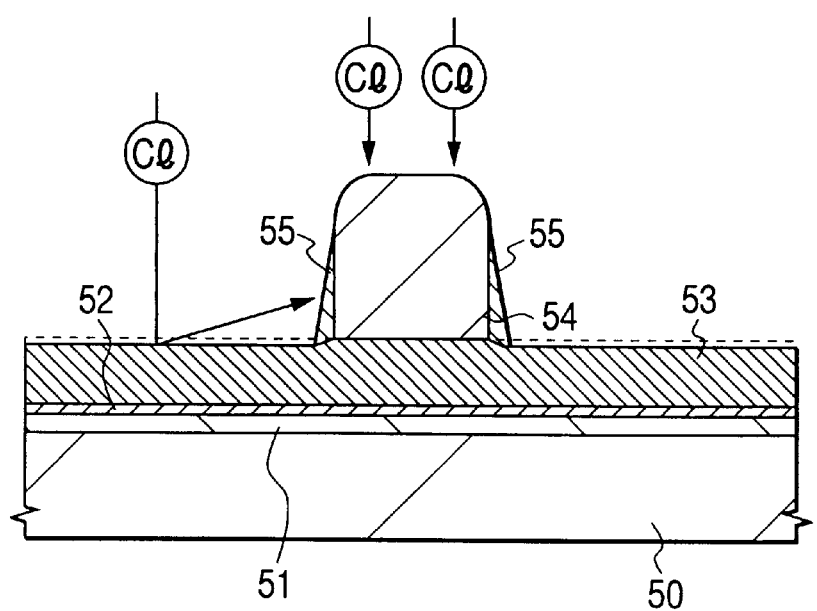
FIG. 4 is a section of an essential portion of a semiconductor substrate and shows a Pt film dry etching method of Embodiment 1 of the present invention.

When the etching of the Pt film 53 is started, the reaction products formed on the surface of the Pt film 53 are partially deposited on the individual side faces of the resist mask 54 and the underlying Pt film 53, as shown in FIG. 4, to form a side wall deposited film 55. When the head of the resist mask 54 is then rounded, the section of the side wall deposited film 55 is given a tapered shape in which the lower portion is thickened whereas the upper portion is thinned.

Figure 5:
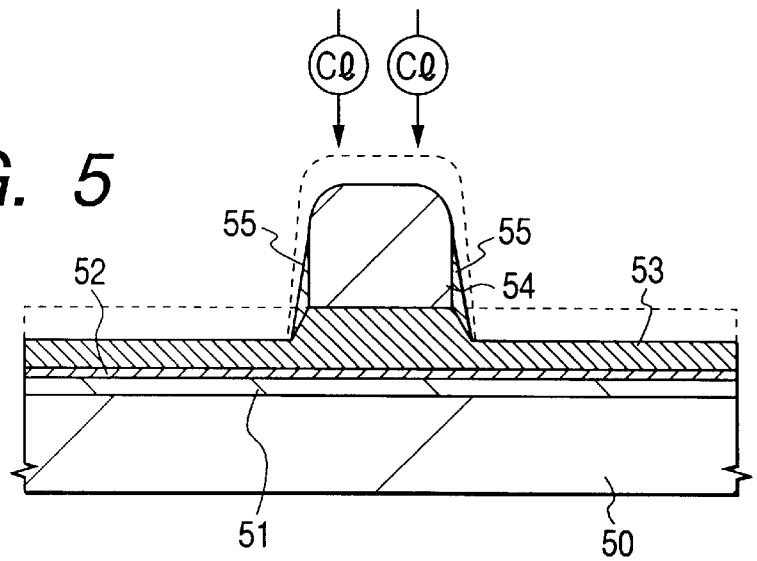
FIG. 5 is a section of an essential portion of a semiconductor substrate and shows a Pt film dry etching method of Embodiment 1 of the present invention.

In accordance with the formation of the side wall deposited film 55, moreover, this film 55 is etched off together with the resist, as shown in FIG. 5, by chlorine ions or the high energy etchants which are produced in the RIE plasma. The side wall deposited film 55 has the tapered sectional shape at this time so that its etching progresses smoothly. Since, moreover, the etching rate by the etchant is reduced by the setting treatment of the resist mask 54, it is possible to prevent a disadvantage that the resist mask 54 disappears before the side wall deposited film 55 is etched off.

Ar ions of another etchant to be produced in the RIE plasma are less able to etch the resist than the chlorine ions but highly contribute to raising the etching rate. The flow rate ratio between the chlorine and the Ar has an optimum value. For a low chlorine flow rate and a high Ar flow rate, for example, the etching rate of the Pt film 53 is high, but the ability to etch off the side wall deposited film 55 together with the resist is low, so that the side wall deposited film 55 is left unetched. For a high chlorine flow rate and a low Ar flow rate, on the other hand, the etching rate of the Pt film 53 is so low that the throughput drops.

Figure 6:
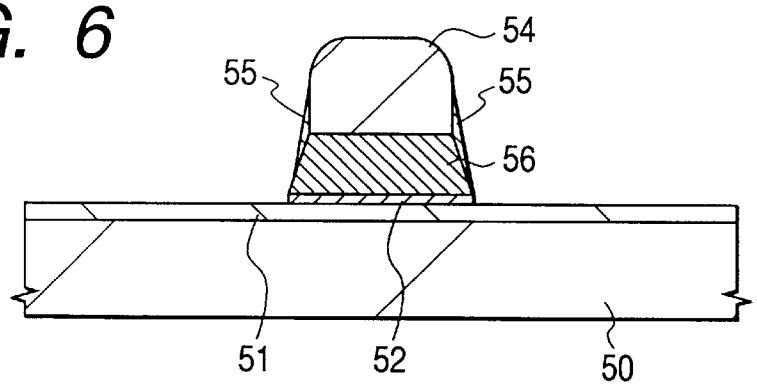
FIG. 6 is a section of an essential portion of a semiconductor substrate and shows a Pt film dry etching method of Embodiment 1 of the present invention.
Figure 7:
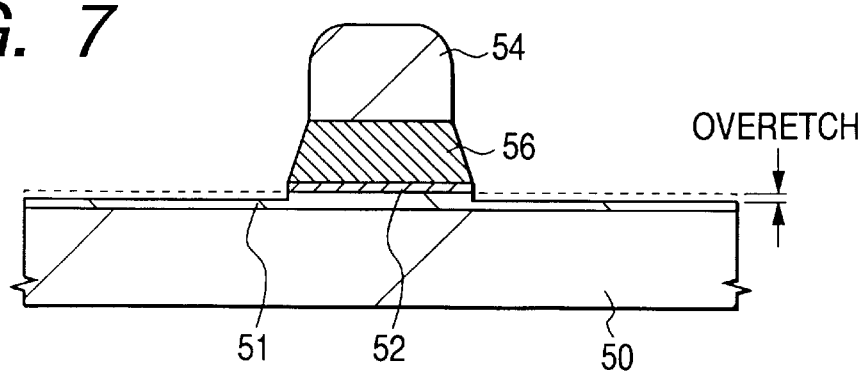
FIG. 7 is a section of an essential portion of a semiconductor substrate and shows a Pt film dry etching method of Embodiment 1 of the present invention.

Thereafter, the step shown in FIG. 4 and the step shown in FIG. 5 are repeated to etch the Pt film 53 and the underlying Ti film 52. FIG. 6 shows the state immediately after the etching of the Ti film 52 is ended and the surface of the underlying silicon oxide film 51 is exposed to the outside. At this time, the side wall deposited film 55 is left on the side faces of the resist mask 54 and the Pt film 53. After this, a Pt pattern 56 is formed, as shown in FIG. 7, by performing an adequate overetching to remove the side wall deposited film 55 completely. The optimum overetching ratio is about 15%.

Next, the aforementioned etching mechanism will be described in more detail on the basis of the experiments using a non-benzophenone novolak resist.

A non-benzophenone novolak resist (e.g., "TSMR CR-N2" produced by Tokyo Ohka Kogyo Co., Ltd.) having much insolubilization at the surface of the unexposed portion, unlike the aforementioned benzophenone novolak resist having little insolubilization at the surface of the unexposed portion, is subjected to exposure and development. Thus, there is formed a resist mask having a generally square outer periphery at its head and a flat shape at its crest, as shown in FIG. 8(a). This resist mask is changed in shape (as shown in FIGS. 8(b), 8(c) and 8(d)) in accordance with the baking temperature, when subjected to an additional bake (twice baking steps).

In the case of an additional bake of 150° C., for example, the entire side face of the resist mask is tapered at about 80 degrees. In the case of an additional bake of 170° C., the root portion is generally upright (90 degrees), but the outer periphery of the head is normally tapered at about 75 degrees. By an additional bake of 190° C., moreover, a semispherical shape is achieved. This semispherical resist can be said to have a generally vertical (90 degrees) root and a head of 45 degrees.

Therefore, these four kinds of resists are used to etch the Pt film and overetch it by 15%. The side wall deposited film is left on both the Pt pattern without any additional bake and the Pt pattern with an additional bake of 150° C. No side wall deposited film is left on the Pt pattern which are additionally baked at 170° C. and at 190° C.

From the experimental results described above, it is found that the resist having the entirely normally tapered side face need not always be used as in the prior art for forming the Pt pattern having no side wall deposited film, and that a resist, normally tapered only at its head, can be used. It can be said in other words that the angle of the root of the resist exerts no influence upon the formation of the side wall deposited film. When the aforementioned benzophenone novolak resist having little insolubilization at the surface of the unexposed portion is used, the shape (having the generally vertical root and the rounded head) having a similar effect to that of the resist having the normally tapered outer periphery at its head can be realized without any additional bake, so that the step can be shortened, compared with the case using the non-benzophenone novolak resist.

Next, the reason why the etching of the Pt film is further improved by setting the resist mask having the rounded head will be described by the following experiments of setting the resist mask.

Figure 9A:
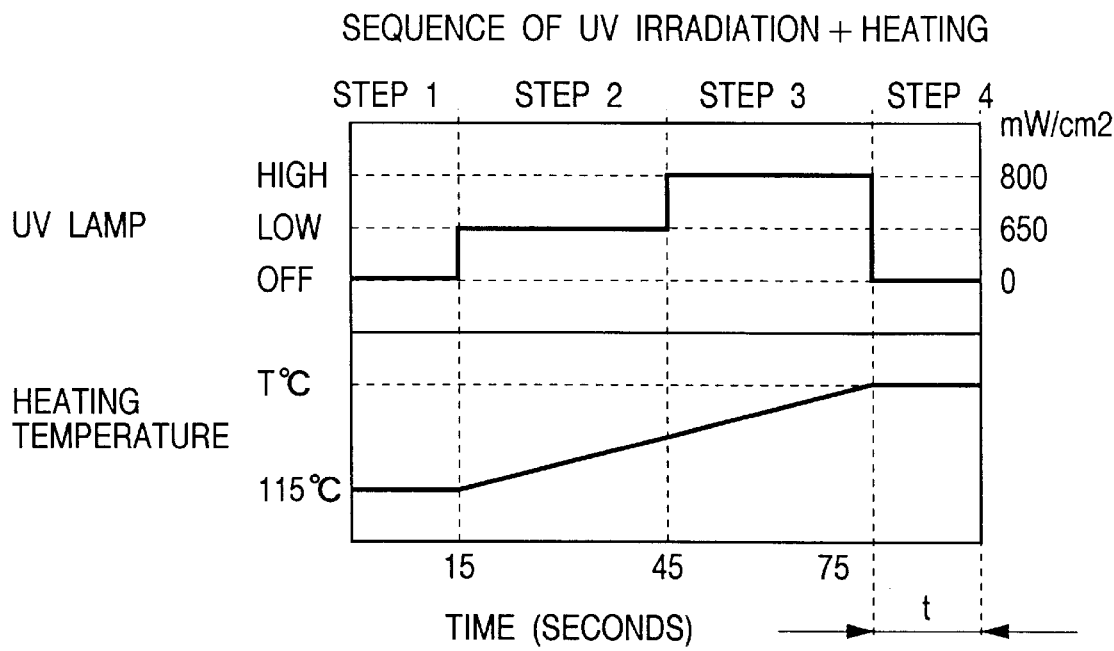
FIG. 9(a) is a flow chart illustrating a sequence of ultraviolet irradiation and heating.

For the irradiation with ultraviolet radiation and for the heating, M150PT (version 2.0) of FUSION SEMICONDUCTOR SYSTEMS Inc., and the setting was performed in the sequence, as shown in FIG. 9(a).

Step 1: a wafer (having a diameter of 6 inches) having a resist mask over a Pt film is heated at 115° C. for 15 seconds.

Step 2: A UV lamp is set in a Low mode while starting the heating to a temperature (T° C.) higher than 115° C., and the ultraviolet rays are emitted in 600 mW/cm$^2$ for 30 seconds.

Step 3: The UV lamp is set in a High mode while continuing the heating, and the ultraviolet rays are emitted in 800 mW/cm$^2$ for 30 seconds.

Step 4: When the temperature reaches T° C., the UV lamp is turned off, and the heating of T° C. is continued for t seconds.

Figure 9B:
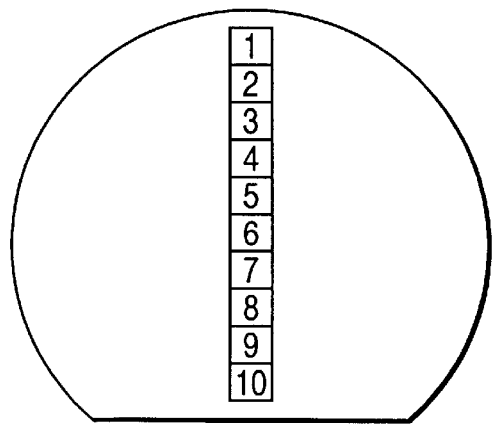
FIG. 9(b) is a top plan view of a wafer, showing regions for confirming the presence or absence of a film deposited on the side face.

As the resist mask, there are used two kinds, i.e., the benzophenone novolak resist ("TSMR9200-B2") having the rounded head and the non-benzophenone novolak resist ("TSMR CR-N2") having the generally square periphery at its head. These individual resist masks are subjected to the treatment of T=140 to 220° C. for t=15 to 60 seconds in the aforementioned sequence. After this, the Pt film is etched by using the magnetron RIE etcher and then overetched by 15%. In order to judge the ability of the resist having the rounded head, the etching was conducted under the conditions that the reaction products are liable to be deposited on the side fact of the Pt pattern (that is, the degree of vacuum in the chamber 5 mTorr, the RF bias =800 W, the chlorine gas flow 15 sccm, and the Ar gas flow =15 sccm). The wafer surface is divided into ten regions, as shown in FIG. 9(b), and these individual regions are observed on the presence/absence of the side wall deposited film by using a section SEM (i.e., scanning electron microscope). The results are tabulated in FIG. 10. In FIG. 10: symbol o indicates no film deposition on the side wall; symbol Δ indicates little film deposition; and symbol X indicates a film deposition.

From the aforementioned experiment results, it has been found, when the resist ("TSMR9200-B2") is used, that the regions having no film deposition on the side wall is larger for a higher heating temperature (T) and a longer heating time (t). In other words, the higher heating temperature (T) and the longer heating time (t) are more advantageous for eliminating the film deposition on the side wall. At a heating temperature (T) over 220° C., however, the resist is burned and denaturated so that the heating temperature cannot exceed that value. Other experiments have revealed that the resist is burned and denaturated even at a heating temperature (T) within a range of 200 to 220° C., if the heating time (t) exceeds 15 seconds. In order to eliminate the film deposition on the side wall, therefore, the heating temperature (T)=200 to 220° C., and the heating time (t)=15 seconds are optimum.

It is also apparent that the film deposition on the side wall cannot be eliminated even if the heating temperature (T) is raised and if the heating time (t) is elongated, when the non-benzophenone novolak resist ("TSMR CR-N2") having the square periphery at its head was used. However, other experiments have revealed that similar results to those of the resist having the rounded head were obtained when the non-benzophenone novolak resist was exposed and developed and was additionally baked to taper its head only.

Figure 11:
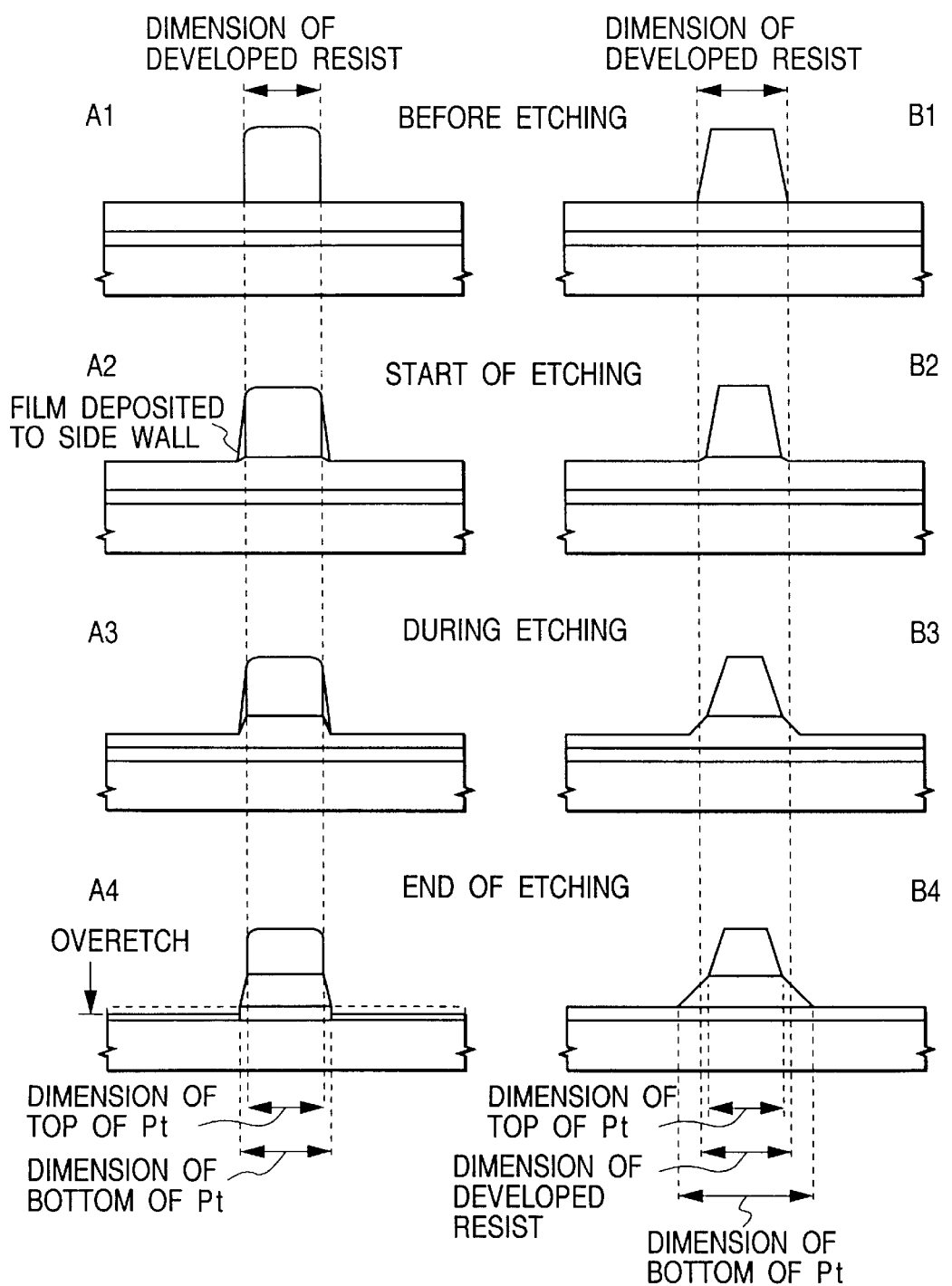
FIG. 11 is an explanatory diagram illustrating the relations between the shapes of resist masks and the Pt pattern sizes.

Next, the difference in the Pt patterns between the case in which the resist mask has the rounded head, and the case in which the resist mask is tapered at about 75 degrees all over its side face, will be described with reference to FIG. 11.

First of all, in the case of using the resist mask (A1) having the rounded head, the normally tapered side wall deposited film (A2) is formed on the side fall of the resist mask (and its lower Pt film) when the etching of the Pt film is started. As a result, the development size of the resist mask and the shape near the root are not changed (A3) even when the etching progresses. In the progress of the etching, the side wall deposited film is etched off in the vicinity of its upper portion together with the resist by chlorine ions. The surface of the tapered portion of the side wall deposited film is also etched off by the etchant such as the chlorine ions. When the Ti film below the Pt film is etched (at the just-etching time), the side wall deposited film is left, but the Pt pattern (A4) having no side wall deposited film is obtained by the subsequent proper overetching. At this time, the side wall deposited film has a normally tapered section, so that it is smoothly etched. The size of the uppermost portion of the Pt pattern obtained is not different from the development size of the resist mask, but the size of the lowermost portion is slightly larger than the development size of the resist mask because the side face is tapered.

In the case of using the resist mask (B1) tapered at 75 degrees all over its side face, the rate for the reaction product to be deposited on the side face of the resist mask is lower than the rate to be etched off by the etchant, so that no side wall deposited film is formed (B2). As a result, not only the upper portion but also the side face of the resist mask is etched off as the etching progresses. In accordance with this, the side face of the Pt pattern is tapered (B3). At the end of the etching, the size of the uppermost portion of the Pt pattern is smaller than the developing size of the resist mask, and the size of the lowermost portion is larger than the development size. The side face of the Pt pattern is tapered at a larger angle (B4).

Thus in the cases of using the resist mask having the rounded head and the resist mask tapered at about 75 degrees all over its side face, both their Pt patterns are tapered at the side faces. The taper has a larger angle in the case of using the resist mask tapered all over its side face, so that a desired pattern size is difficult to achieve when the size is minute. For forming a finer Pt pattern in a higher dimensional accuracy, therefore, the resist mask having the rounded head (or the resist mask normally tapered at its head only) is better than the resist mask tapered all over its side face.

Next, the process for manufacturing a DRAM, one type of semiconductor memory of the present embodiment will be described with reference to FIGS. 12 to 33.

Figure 12:
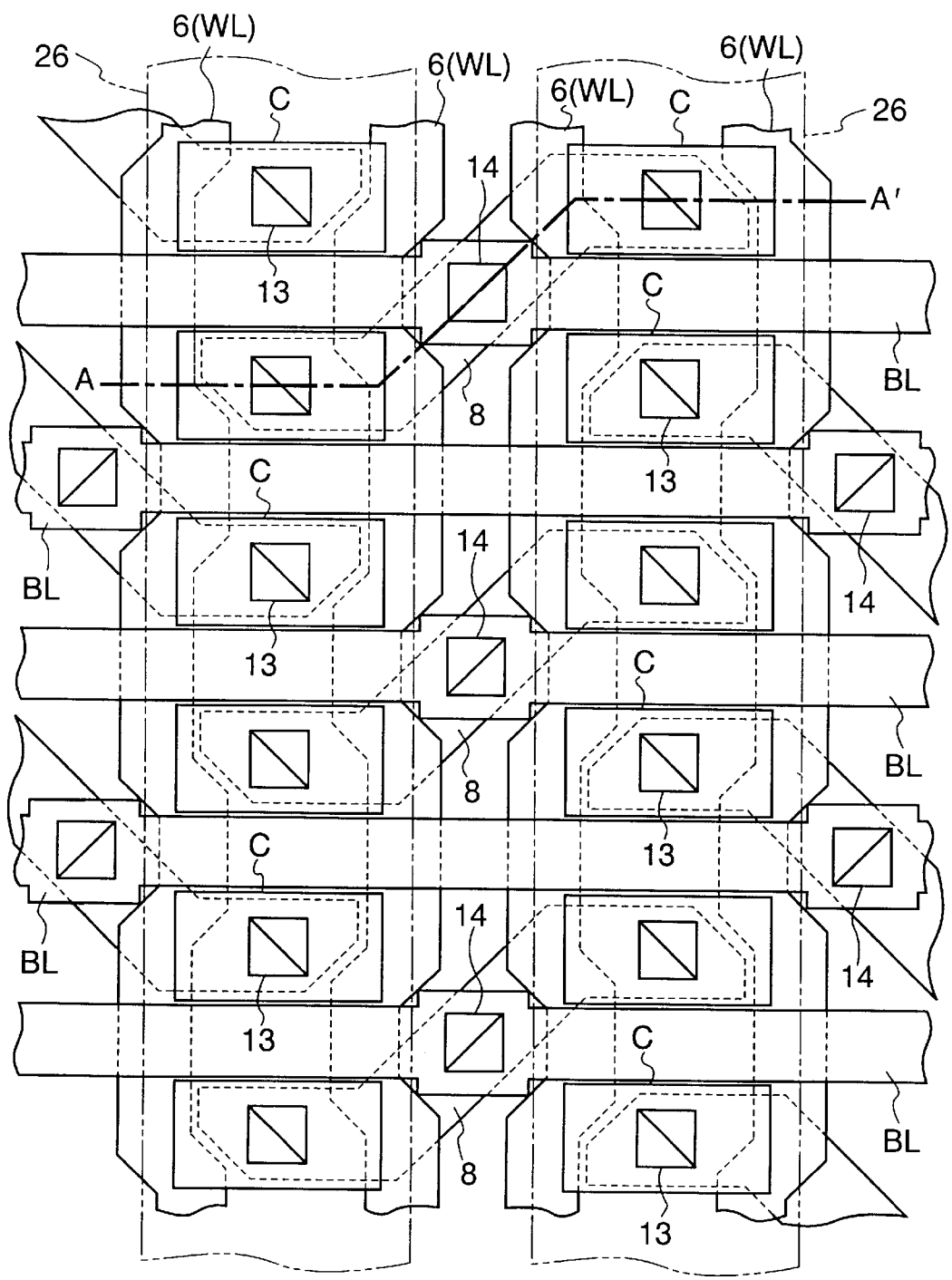
FIG. 12 is a top plan view showing the layout of a DRAM of Embodiment 1 of the present invention.

FIG. 12 is a top plan view showing the layout of memory cells of the DRAM. The memory cells of this DRAM adopt the two-intersection cells and the COB (Capacitor Over Bitline) structure in which data storing capacitive elements are arranged over bit lines. The transistor (the memory cell selecting MISFET) of each memory cell is connected through a bit line BL with a peripheral circuit. The bit line BL is connected through a connection hole 14 with one of semiconductor regions 8 (the source region and the drain region) of the memory cell selecting MISFET. The operation of the memory cell selecting MISFET is controlled by a word line WL (a gate electrode 6). This word line WL (the gate electrode 6) is connected with a peripheral circuit. A data storing capacitive element C arranged over the bit line BL is connected through a connection hole 13 with the other of the semiconductor regions 8 (the source region and the drain region) of the memory cell selecting MISFET. The data storing capacitive element C is connected with a plate electrode 26 with a peripheral circuit.

This planar layout has a first feature that one plate electrode 26 is arranged for two word lines WL. Thanks to this layout, the capacitance of the plate electrode 26 can be made smaller than that in an ordinary DRAM, so that the potential of the plate electrode 26 can be easily controlled by the peripheral circuit. The number of the plate electrode 26 may be one for one word line WL and one for three word lines WL. Here, the degree of integration is difficult to raise, when the number of the plate electrode 26 increases for the word lines WL. When the number decreases for the number of the word lines WL, on the other hand, the capacitance of the plate electrode 26 increases and it is difficult to control by the peripheral circuit. The optimum number of the plate electrodes 26 changes according to the use of the DRAM.

This planar layout has a second feature that the plate electrodes 26 are extended in the same direction as that of the word lines WL (or the gate electrodes 6). As a result, the potential of the plate electrodes 26 can be controlled by the peripheral circuit in synchronism with the potential of the word lines WL.

Figure 13:
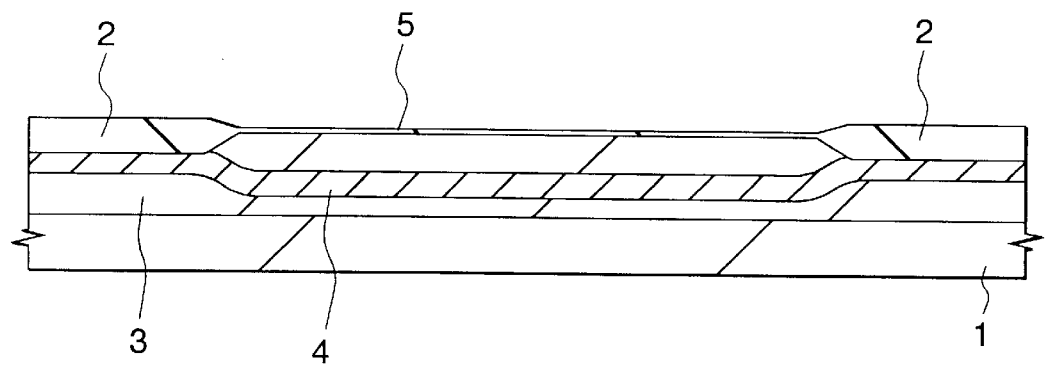
FIG. 13 is section of an essential portion of the semiconductor substrate and shows a process for manufacturing a DRAM of Embodiment 1 of the present invention.

In order to manufacture the memory cells of this DRAM, a semiconductor substrate 1 of p⁻-type single crystal silicon is prepared at first, as shown in FIG. 13 (i.e., a section taken along line A - A' of FIG. 12). A field oxide film 2 is formed over the surface of the semiconductor substrate 1 by the selective oxidation (LOCOS) method, and the semiconductor substrate 1 is then doped with ions of p-type impurity (B) to form a p-type well 3. Subsequently, the p-type well 2 is doped with ions of a p-type impurity (B) to form a p-type channel stopper layer 4, and a gate oxide film 5 is formed by the thermal oxidation method over the surface of the active region of the p-type well 3 enclosed by the field oxide film 2.

Figure 14:
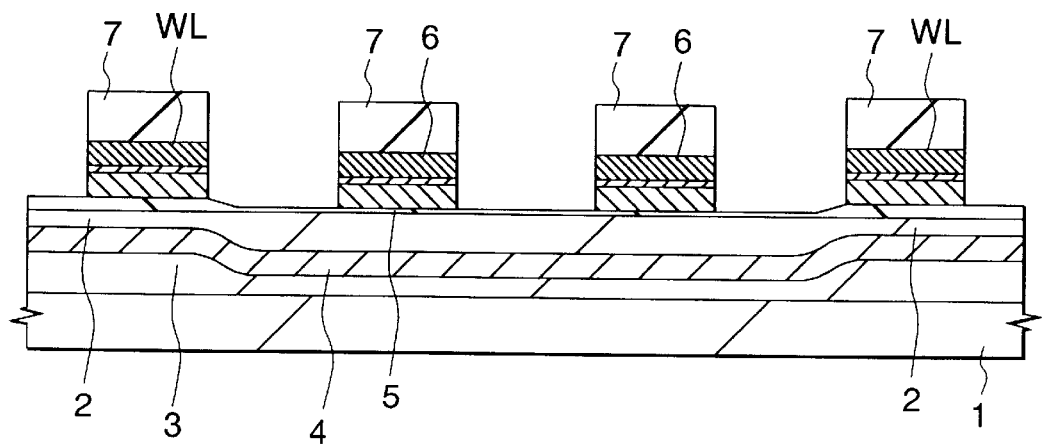
FIG. 14 is section of an essential portion of the semiconductor substrate and shows a process for manufacturing a DRAM of Embodiment 1 of the present invention.

Next, the gate electrodes 6 (the word lines WL) of the memory cell selecting MISFET are formed, as shown in FIG. 14. The gate electrodes 6 (the word lines WL) are formed, for example, by depositing a polycrystalline silicon film over the semiconductor substrate 1 by a CVD method, by depositing a TiN film and a W film by sputtering, by depositing a silicon nitride film 7 formed as the cap insulating film by a plasma CVD method, and by patterning those films by etching using a photoresist as the mask. The polycrystalline silicon film forming a portion of the gate electrodes (the word lines WL) is doped with an n-type impurity (P) so that its resistance may be reduced. Here, the resist to be used for forming the gate electrodes 6 (the word lines WL) is the non-benzophenone novolak resist having a generally square periphery at its head.

Figure 15:
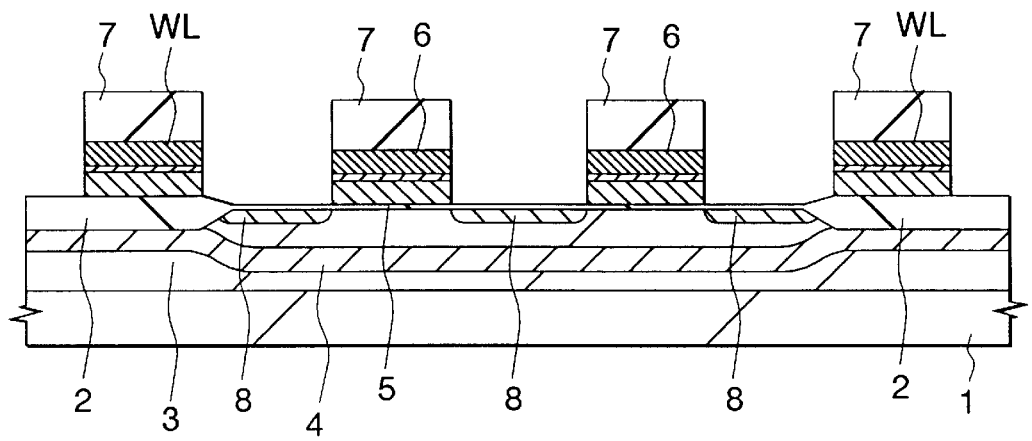
FIG. 15 is section of an essential portion of the semiconductor substrate and shows a process for manufacturing a DRAM of Embodiment 1 of the present invention.
Figure 16:
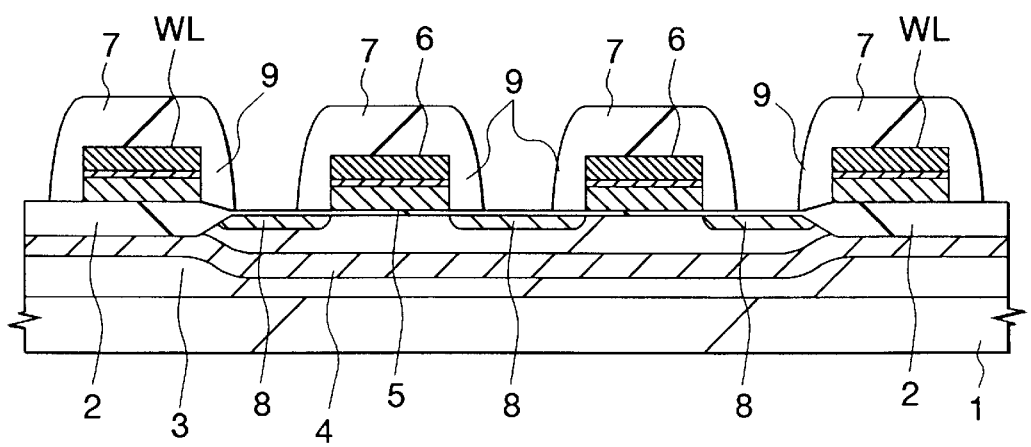
FIG. 16 is section of an essential portion of the semiconductor substrate and shows a process for manufacturing a DRAM of Embodiment 1 of the present invention.

Next, the p-type well 2 is doped with ions of an n-type impurity (P) to form the n-type semiconductor regions 8 and 8 (the source region and the drain region) of the memory cell selecting MISFET in the p-type wells 2 on the two sides of the gate electrodes 6 (the word lines WL), as shown in FIG. 15. After this, side wall spacers 9 are formed on the side faces of the gate electrodes 6 (the word lines WL), as shown in FIG. 16. The side wall spacers 9 are formed by anisotropically etching the silicon nitride film which is deposited over the gate electrodes 6 (the word lines WL) by a plasma CVD method.

Figure 17:
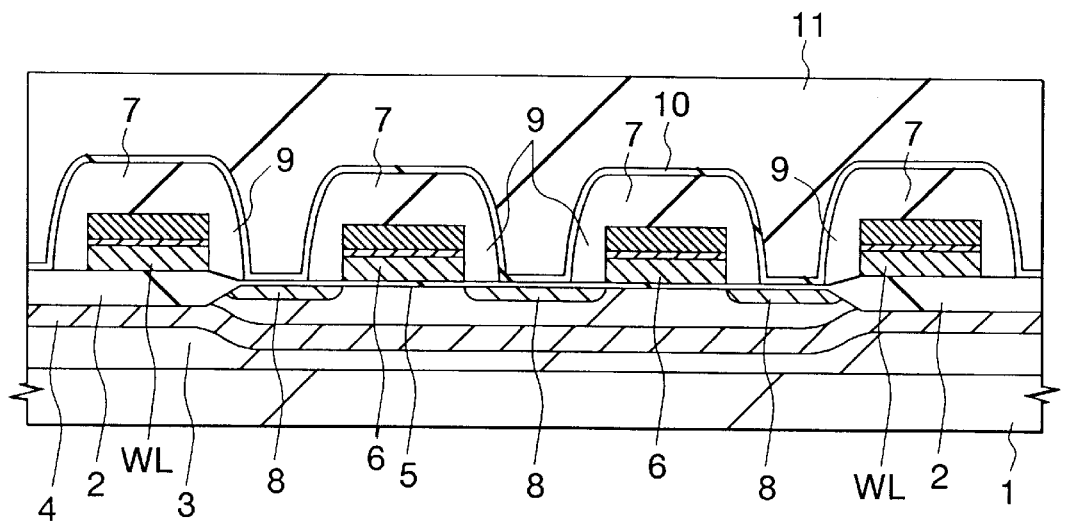
FIG. 17 is section of an essential portion of the semiconductor substrate and shows a process for manufacturing a DRAM of Embodiment 1 of the present invention.

Next, a silicon oxide film 10 and a BPSG (Boron-doped Phospho Silicate Glass) film 11 are deposited over the memory cell selecting MISFET, as shown in FIG. 17. After this, the BPSG film 11 is polished to flatten its surface by a CMP (Chemical-Mechanical Polishing) method.

Figure 18:
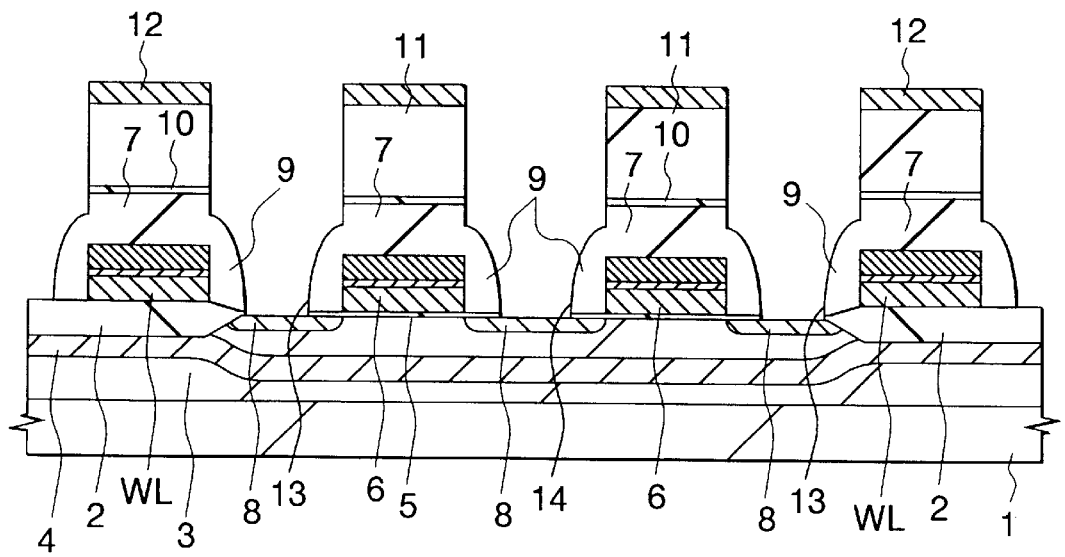
FIG. 18 is section of an essential portion of the semiconductor substrate and shows a process for manufacturing a DRAM of Embodiment 1 of the present invention.
Figure 19:
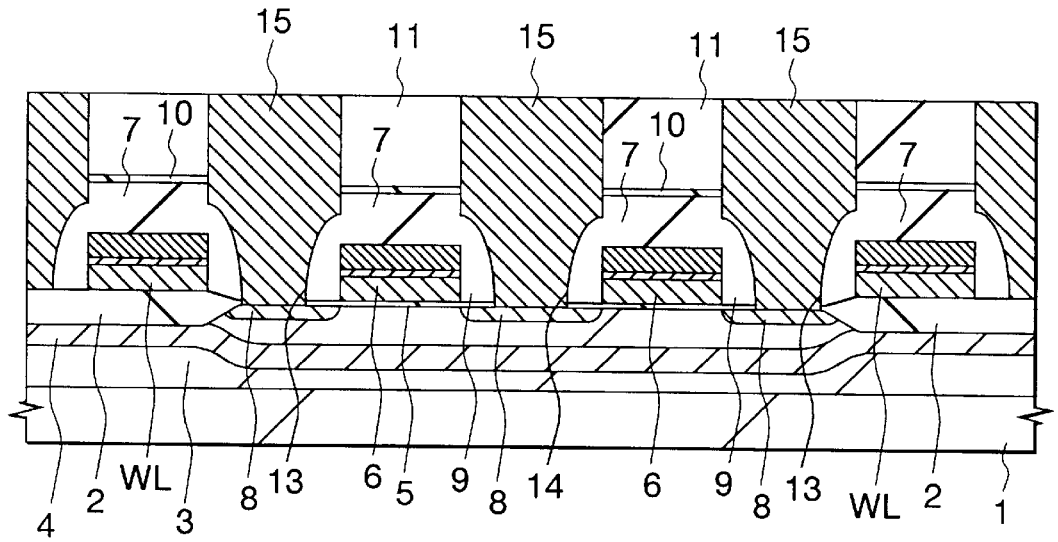
FIG. 19 is section of an essential portion of the semiconductor substrate and shows a process for manufacturing a DRAM of Embodiment 1 of the present invention.

Next, a polycrystalline silicon film 12 is deposited over the BPSG film 11 by a CVD method, as shown in FIG. 18. After this, the non-benzophenone novolak resist having a generally square periphery at its head is used as the mask to etch the polycrystalline silicon film 12, the BPSG film 11, the silicon oxide film 10 and the gate oxide film 5, thereby to form the connection hole 13 over one (the n-type semiconductor region 8) of the source region and the drain region of the memory cell selecting MISFET and the connection hole 14 over the other (the n-type semiconductor region 8). At this time, the silicon nitride film 7 formed over the gate electrodes 6 (the word lines WL) of the memory cell selecting MISFET, and the side wall spacers 9 of silicon nitride formed on the side faces, are slightly etched so that the connection holes 13 and 14 having small diameters can be formed in a self-alignment manner even though no alignment allowance between the connection holes 13 and 14 and the gate electrodes 6 (the word lines WL) is given.

Next, a plug 15 of polycrystalline silicon is buried in the connection holes 13 and 14. This plug 15 is formed by depositing a polycrystalline silicon film over the polycrystalline silicon film 12 by a CVD method and by etching back the deposited polycrystalline silicon film and the polycrystalline silicon film 12. The polycrystalline silicon film forming the plug 15 is doped with n-type impurities (P). The plug 15 may be formed by burying not only the polycrystalline silicon but also TiN, W, Ti or Ta.

Figure 20:
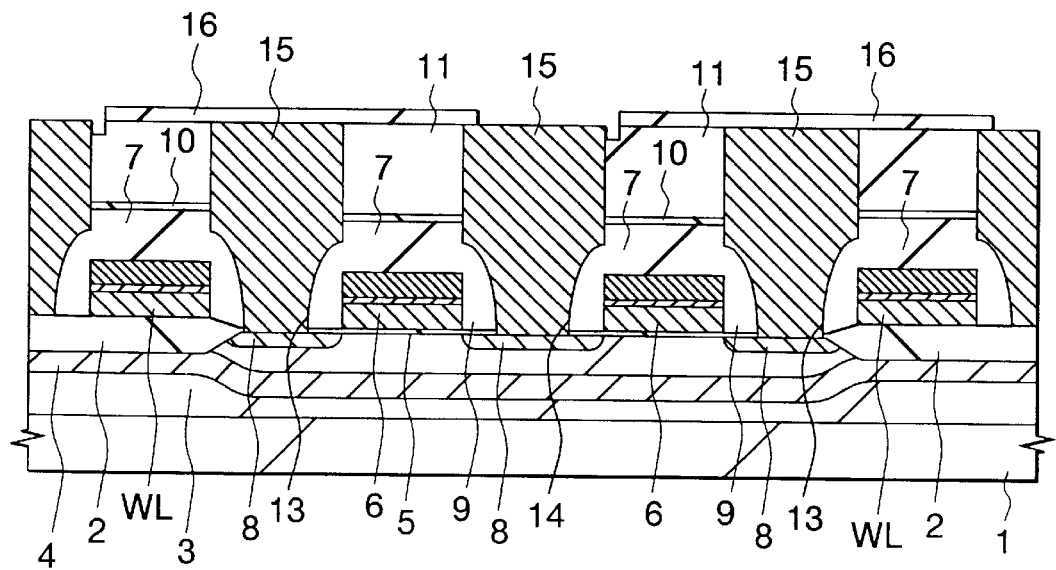
FIG. 20 is section of an essential portion of the semiconductor substrate and shows a process for manufacturing a DRAM of Embodiment 1 of the present invention.
Figure 21:
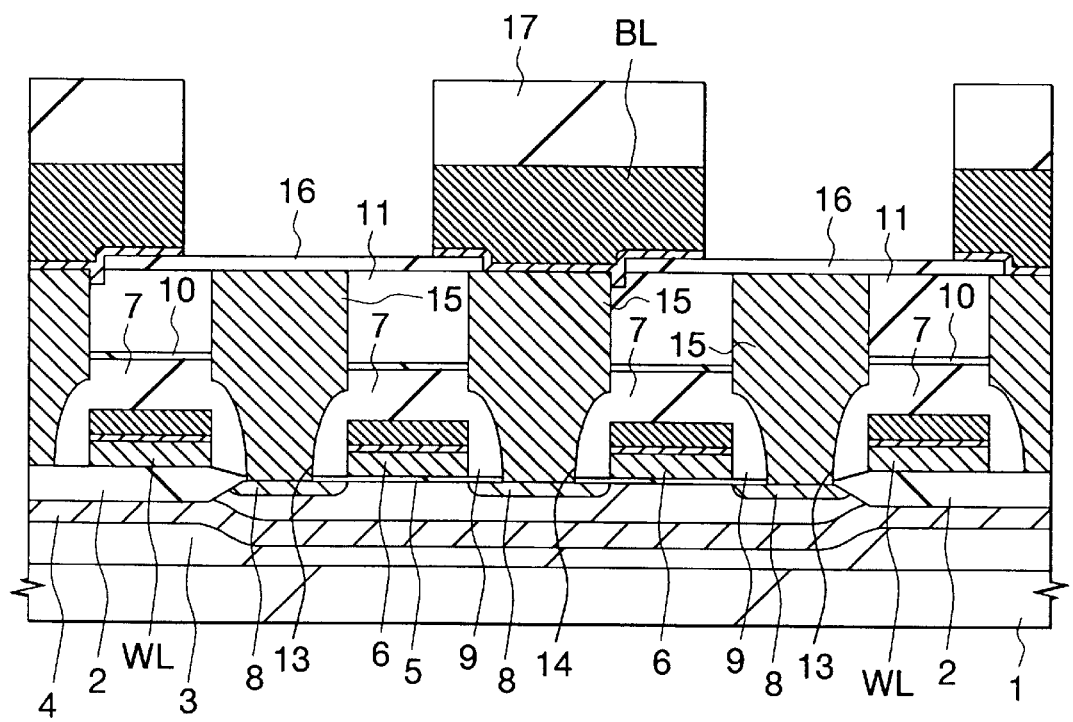
FIG. 21 is section of an essential portion of the semiconductor substrate and shows a process for manufacturing a DRAM of Embodiment 1 of the present invention.

Next, a silicon oxide film 16 is deposited over the BPSG film 11 by a CVD method, as shown in FIG. 20. Then, the silicon oxide film 16 over the connection holes 14 is etched off by using the mask of the non-benzophenone novolak resist having a generally square periphery at its head. After this, the bit lines BL are formed over the connection holes 14, as shown in FIG. 21. The bit lines BL are formed by depositing the TiN film and the W film over the silicon oxide film 16 by sputtering, by depositing a silicon nitride film 17 for a cap insulating film by a plasma CVD method, and by patterning those films by etching using the mask of the non-benzophenone novolak resist having a generally square periphery at its head.

Figure 22:
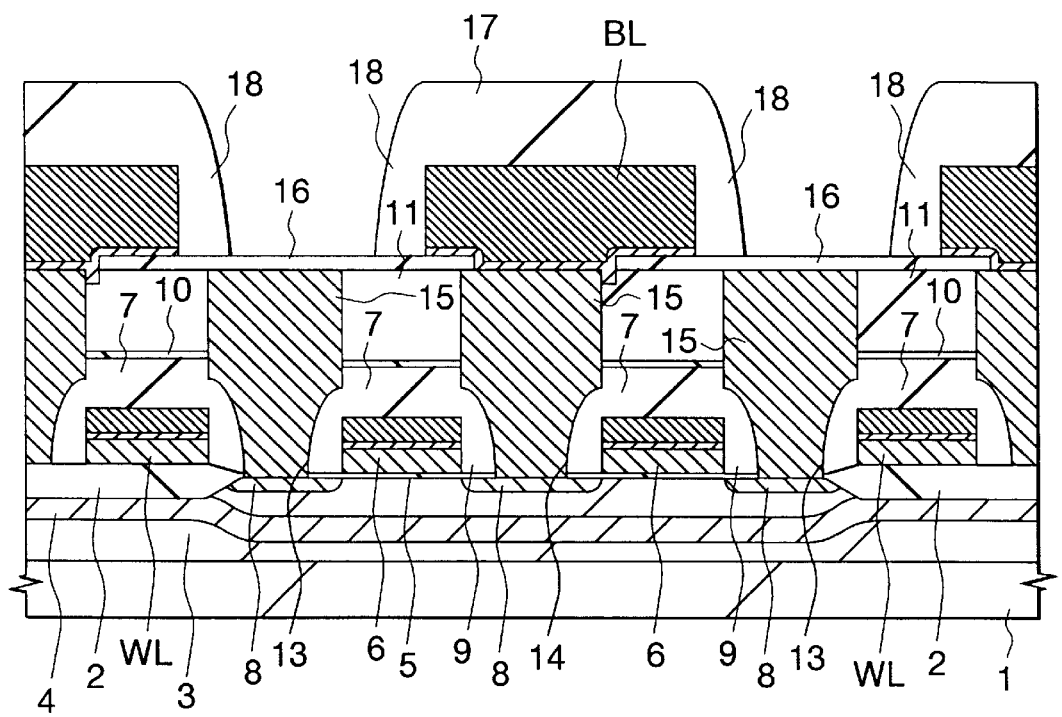
FIG. 22 is section of an essential portion of the semiconductor substrate and shows a process for manufacturing a DRAM of Embodiment 1 of the present invention.

Next, side wall spacers 18 are formed on the side faces of the bit lines BL, as shown in FIG. 22. These side wall spacers 18 are formed by anisotropically etching the silicon nitride film which is deposited over the bit lines BL by a plasma CVD method.

Figure 23:
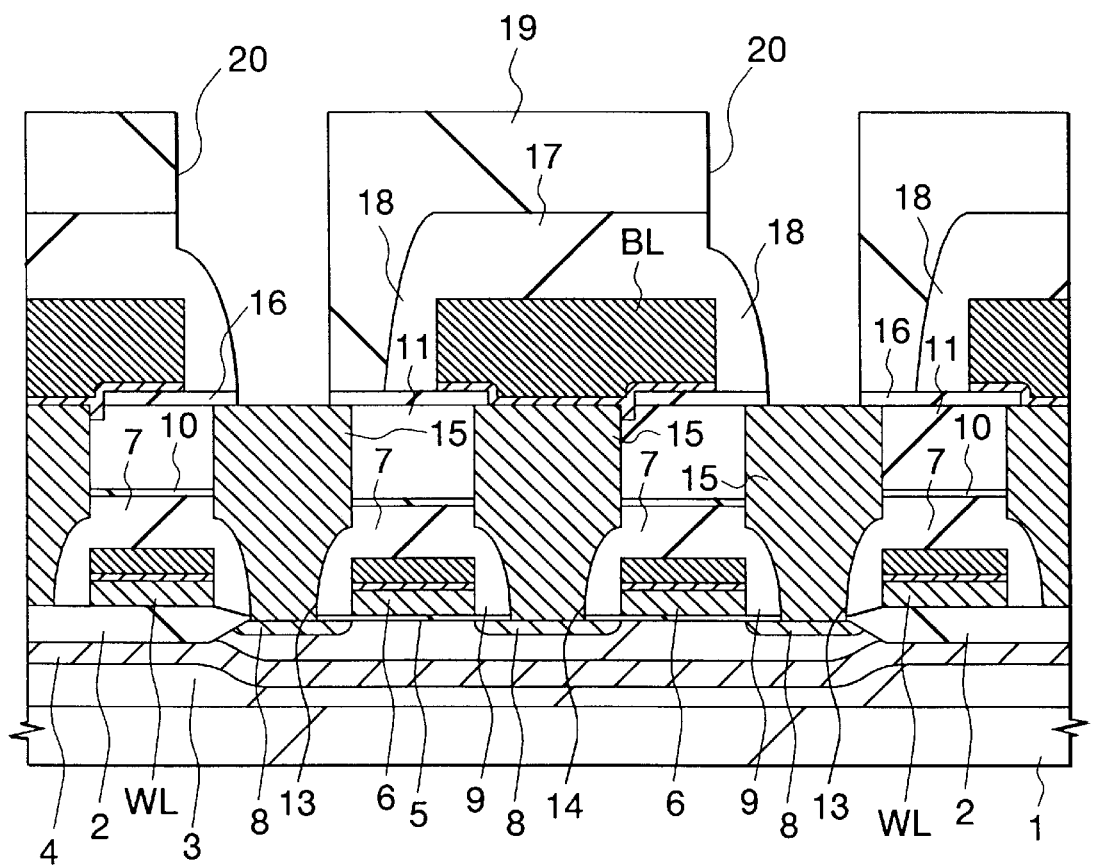
FIG. 23 is section of an essential portion of the semiconductor substrate and shows a process for manufacturing a DRAM of Embodiment 1 of the present invention.

Next, a BPSG film 19 having a thickness of about 300 nm is deposited over the bit lines BL by a CVD method and is subjected to reflow, as shown in FIG. 23. After this, the non-benzophenone novolak resist having a generally square periphery at its head is used as the mask to etch the BPSG film 19 and the silicon oxide film 16 thereby to form connection holes 20 over the connection holes 13 which are formed over the other (the n-type semiconductor region 8) of the source region and the drain region of a memory cell selecting MISFET Qt. At this time, the silicon nitride film 17 over the bit lines BL and the side wall spacers 18 on the side faces act as the etching stopper, so that the connection holes 20 are formed in a self-alignment manner, like the aforementioned connection holes 13 and 14.

Figure 24:
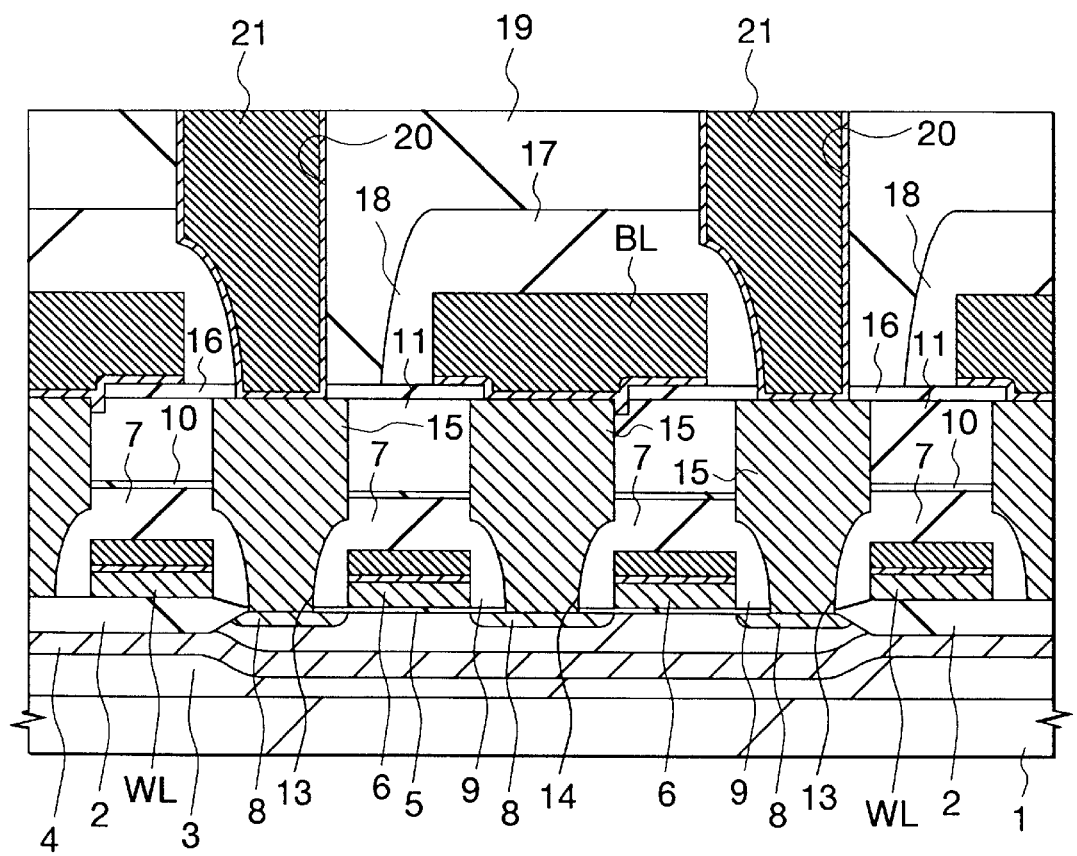
FIG. 24 is section of an essential portion of the semiconductor substrate and shows a process for manufacturing a DRAM of Embodiment 1 of the present invention.
Figure 25:
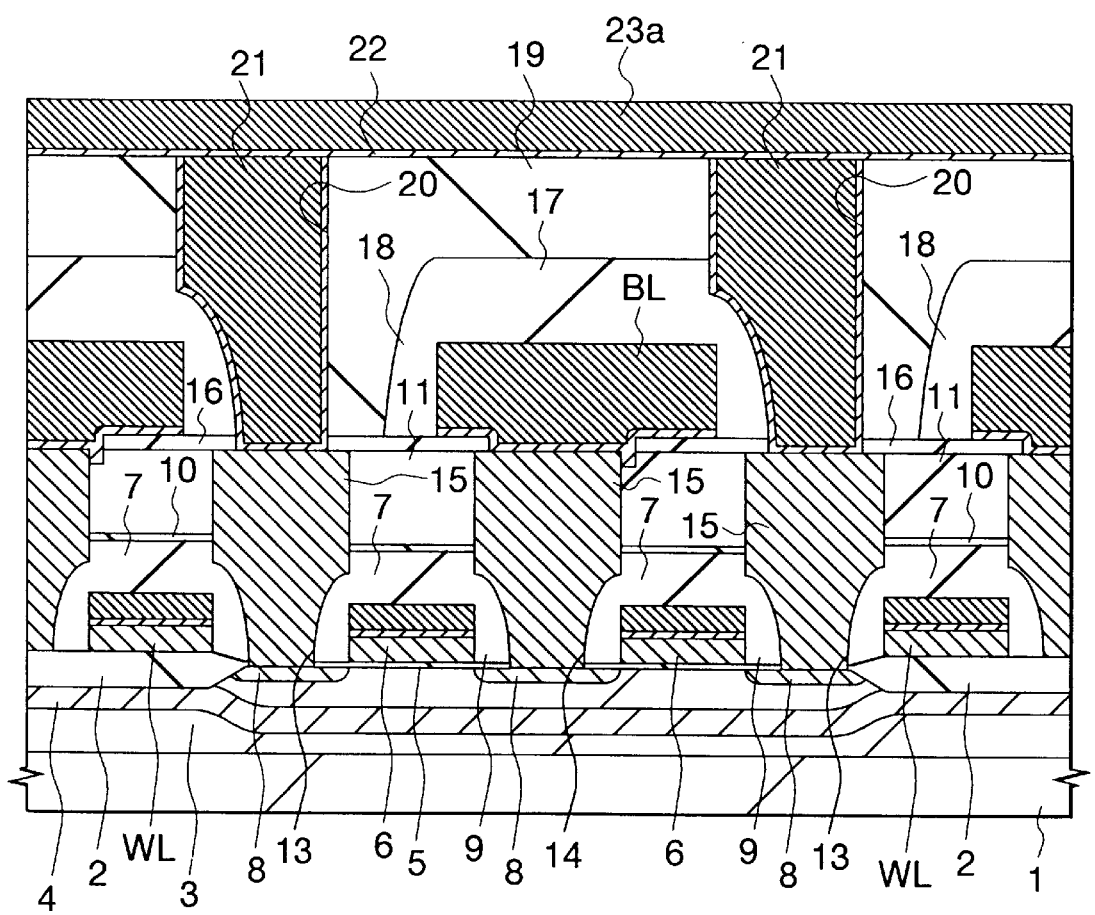
FIG. 25 is section of an essential portion of the semiconductor substrate and shows a process for manufacturing a DRAM of Embodiment 1 of the present invention.
Figure 26:
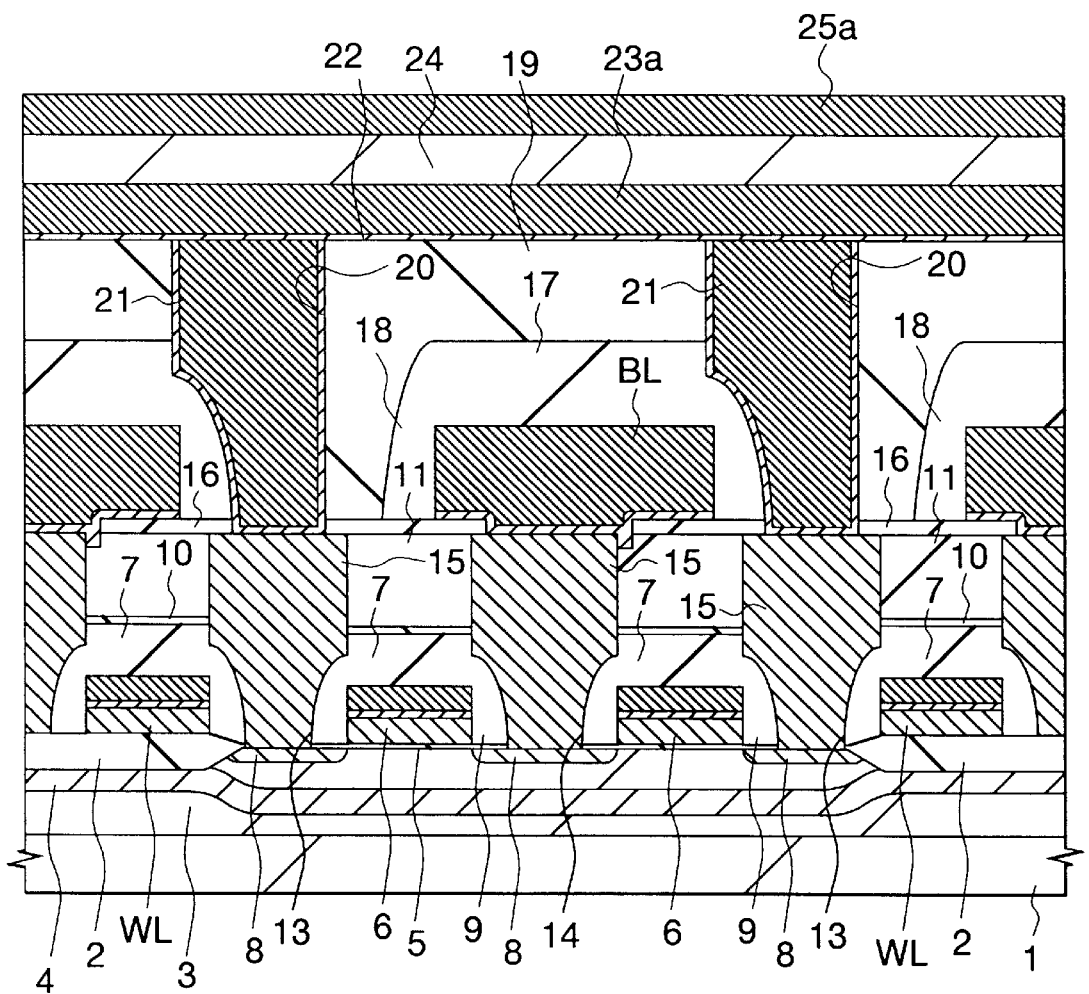
FIG. 26 is section of an essential portion of the semiconductor substrate and shows a process for manufacturing a DRAM of Embodiment 1 of the present invention.

Next, as shown in FIG. 24 a plug 21 is buried in the connection holes 20. This plug 21 is formed by depositing the TiN film and the W film over the BPSG film 19 by, e.g., sputtering, and by etching back necessary, after the filming step, to a crystallizing heat treatment, when the material of the capacitor insulating film 24 needs it.

The present embodiment will be described in the case in which the electrode material for the data storing capacitive element is Pt and in which the material for the capacitive insulating film is PZTBST, but the present invention should not be limited thereto.

Considering the application to a nonvolatile RAM, the electrode material can be not only Pt but also Ir, $IrO_2$, Rh, $RhO_2$, Os, $OsO_2$, Ru, $RuO_2$, Re, $ReO_3$, Pd, Au or a multilayer film thereof. The $RuO_2$ or $IrO_2$ can be deposited by a MOCVD method to form a thin film having an excellent coverage. The anti-oxidation property of the film can be improved by forming a layer of Ru or Ir having a high barrier property against oxygen over the thin film. If the oxidation can be suppressed at the interface of the capacitor insulating film, moreover, the upper electrode material can be W, Al, TiN, Ta, Cu, Ag or a multilayer film thereof.

The material for the capacitive insulating film may be not only by PZT but also $Ta_2O_5$, silicon oxide or silicon nitride to be deposited by a CVD method.

There can also be used any one of various ferroelectric materials, such as $PbZrO_3$, $LiNbO_3$, $Bi_4Ti_3O_{12}$, $BaMgF_4$, PLZT, BST ($(Ba, Sr)TiO_4$) or Yl ($SrBi_2 (Nb, Ta)_2O_9$). These ferroeletric materials can be deposited not only by a sputtering method but also a MOCVD method, a sol-gel method or a laser abrasion method.

Figure 27:
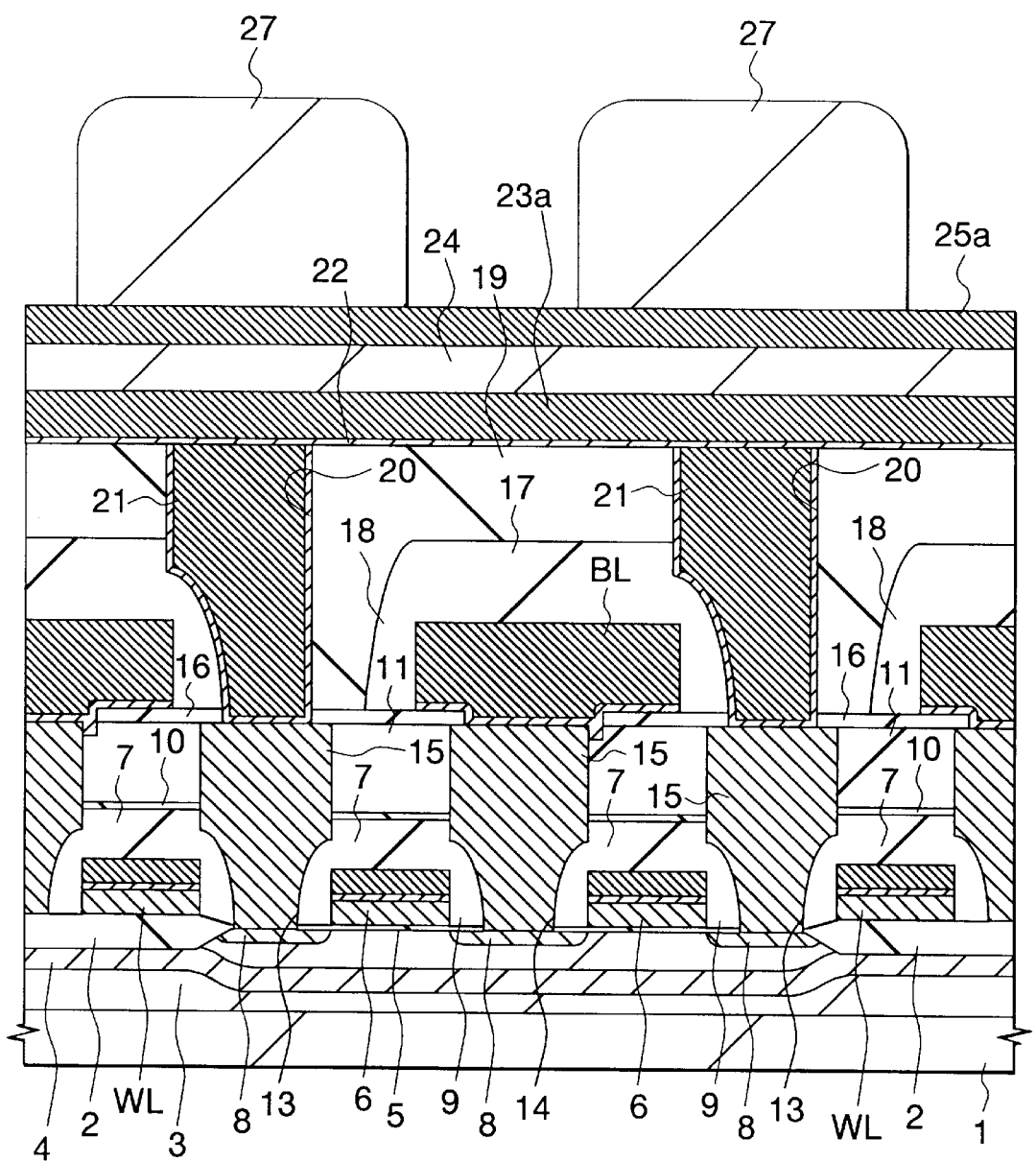
FIG. 27 is section of an essential portion of the semiconductor substrate and shows a process for manufacturing a DRAM of Embodiment 1 of the present invention.

Next, as shown in FIG. 27, the benzophenone novolak resist is applied to the Pt film 25a or the upper electrode material by spin-coating and is exposed and developed to form a resist mask 27 having a rounded outer periphery at its head, and this resist mask 27 is then set by heating it to about 200° C. while being irradiated with ultraviolet radiation.

Alternatively, the non-benzophenone novolak resist may be exposed and developed to form a resist mask having generally square periphery at its head, and this resist mask is additionally baked (twice) to taper only the head. After this, the baked resist mask is heated and set while being irradiated with the ultraviolet beam.

Figure 28:
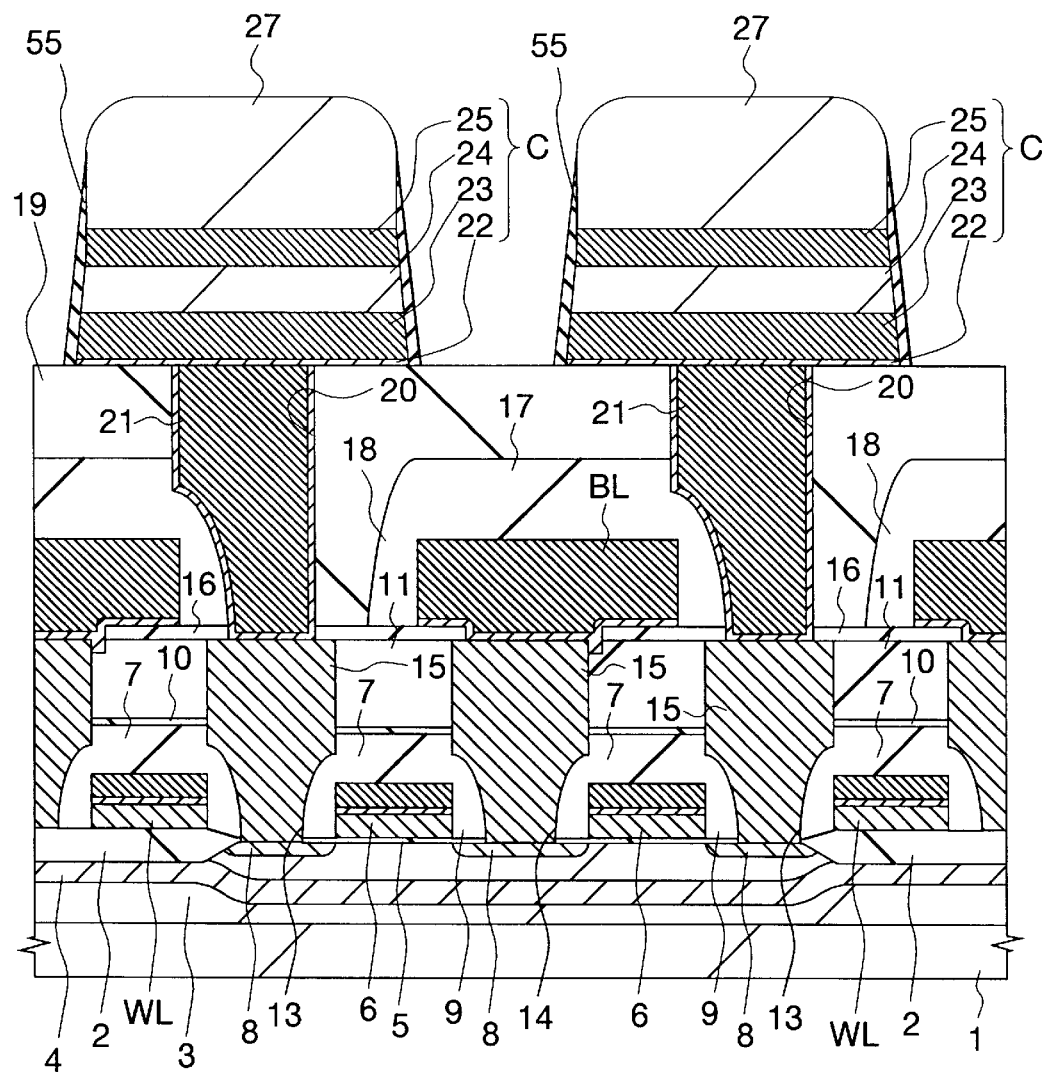
FIG. 28 is section of an essential portion of the semiconductor substrate and shows a process for manufacturing a DRAM of Embodiment 1 of the present invention.

Next, as shown in FIG. 28, the magnetron RIE etcher is used to dry-etch the Pt film 25a, the capacitor insulating film 24, the Pt film 23a and the barrier metal 22 uncovered with the resist mask 27, to form the data storing capacitive element (capacitor) C which is made by forming the lower electrode 23 of the Pt film 23a, the capacitor insulating film 24 of the PZT film, and the upper electrode 25 of the Pt film 25a over the barrier metal 22.

The Pt film 25a, the capacitor insulating film 24 and the Pt film 23a may be individually etched by using different resist masks. In this case, the resist mask 27 is used to form the upper electrode 25 by dry-etch the Pt film 25 and is then ashed off. Next, the resist mask 27 is exposed and developed by applying the benzophenone novolak resist by spin-coating, to form the second resist mask having a rounded outer periphery at its head. After this, the resist mask is set by the aforementioned method.

Next, the second resist mask is used to dry-etch the capacity insulating film 24 and is then ashed off. Next, the resist mask is exposed and developed by applying the benzophenone novolak resist by spin-coating, to form the third resist mask having a rounded outer periphery at its head. After this, the resist mask is set by the aforementioned method. Next, the third resist mask is used to dry-etch the Pt film 23a and the barrier metal 22 thereby to form a lower electrode 23, and is then ashed off.

After this, an overetching is performed to remove the side wall deposited film 55 from the side faces of the resist mask 27 and the data storing capacitive element (capacitor) C.

Figure 29:
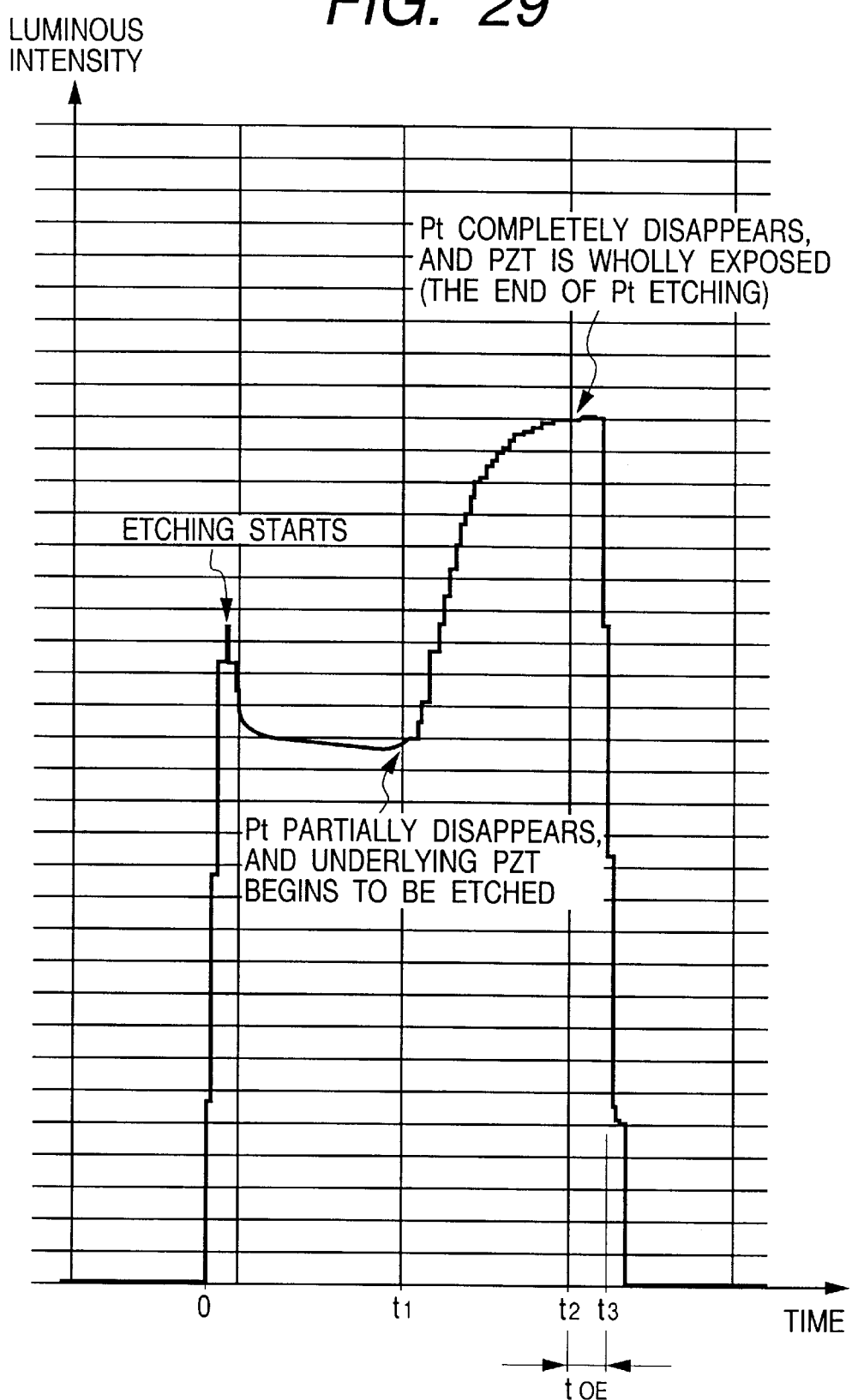
FIG. 29 is a graph showing the change in the luminous intensity of plasma light when the PT film on a PZT film is etched.

FIG. 29 is a graph showing the change in the luminous intensity of plasma light when the Pt film 25a (having a thickness of 100 nm) over the capacitive insulating film 24 of PZT is etched. The time period from 0 to $t_1$ on the abscissa is required for the Pt film 25a to be etched; the time period from $t_1$ to $t_2$ is required for the underlying capacitor insulating film 24 to be wholly exposed (till the Pt film 25a completely disappears) after the underlying capacitor insulating film 24 starts to be exposed; and the time period from $t_2$ to $t_3$ is required for the overetching treatment.

Here, a proper overetching time period (tOE) corresponds to the time period ($t_2 \times 0.15$) of 15% of $t_2$, if the $t_2$ is determined as the just etching time, if the time period from $t_3$ to $t_2$ (=tOE) is determined as the overetching time period, and if the $t_3$ is determined as the total etching time period. Specifically, if the just etching time ($t_2$) of the Pt film 25a having a thickness of 100 nm is 52 seconds, the overetching time (tOE) is set to 52×0.15=7.8 seconds. In this case, the total etching time ($t_3$) is set to 52+7.8=59.8 seconds.

Figure 30:
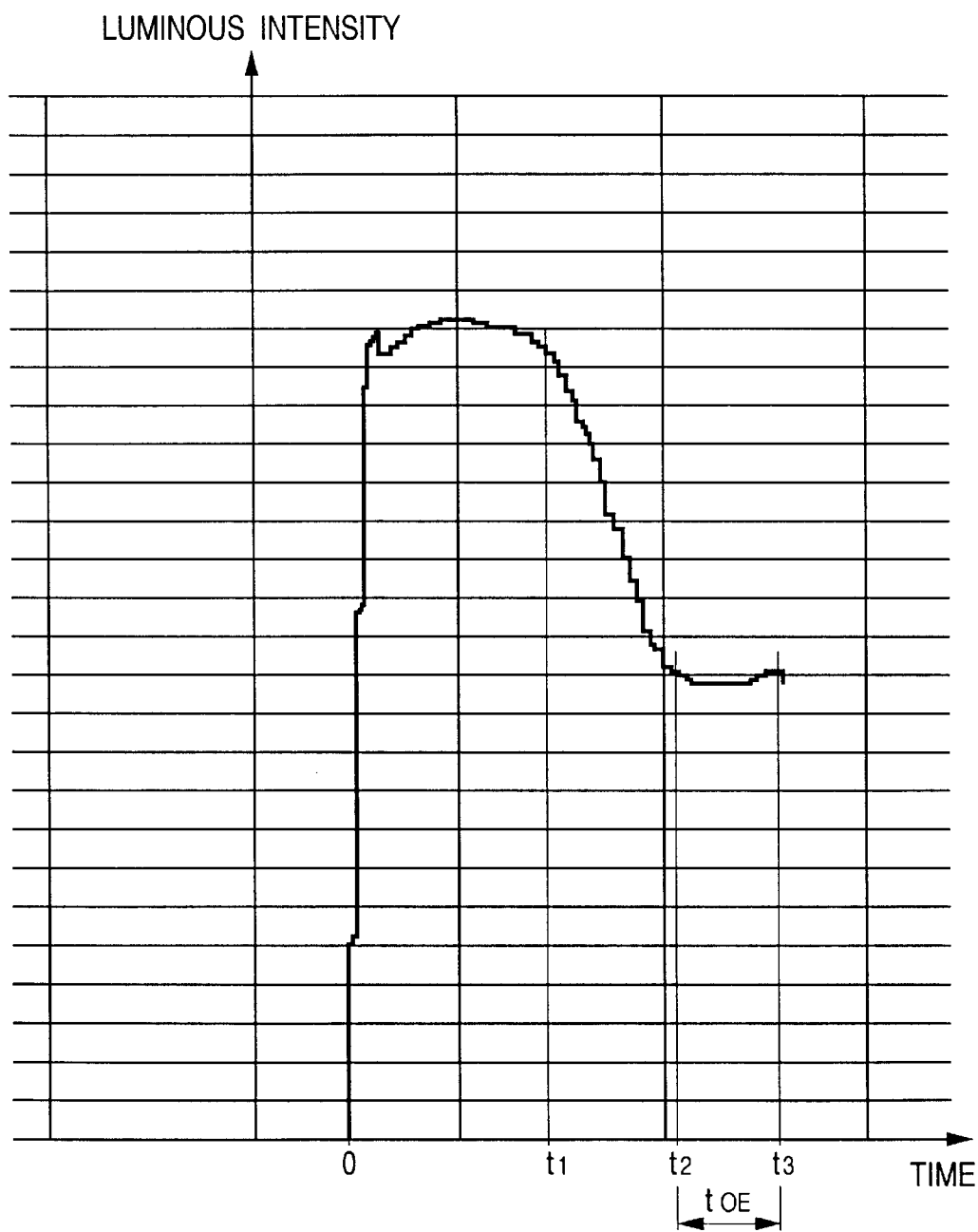
FIG. 30 is a graph showing the change in the luminous intensity of plasma light when the PT film on a PZT film Is etched.

FIG. 30 is a graph showing the change in the luminous intensity of plasma light (having a wavelength of 4.6 nm) when the capacity insulating film (the PZT film) 24 (having a thickness of 250 nm) over the Pt film 23a is etched. The adequate overetching time (tOE) for the capacitor insulating film 24 corresponds to the time period ($T_2 \times 0.1$) of 10% of $t_2$. Specifically, if the just etching time of the capacitor insulating film 24 having a thickness of 250 nm is 54 seconds, the overetching time (tOE) is set to 54×0.1=54 seconds. In this case, the total etching time (t3) is set to 54+5.4=59.4 seconds.

Figure 31:
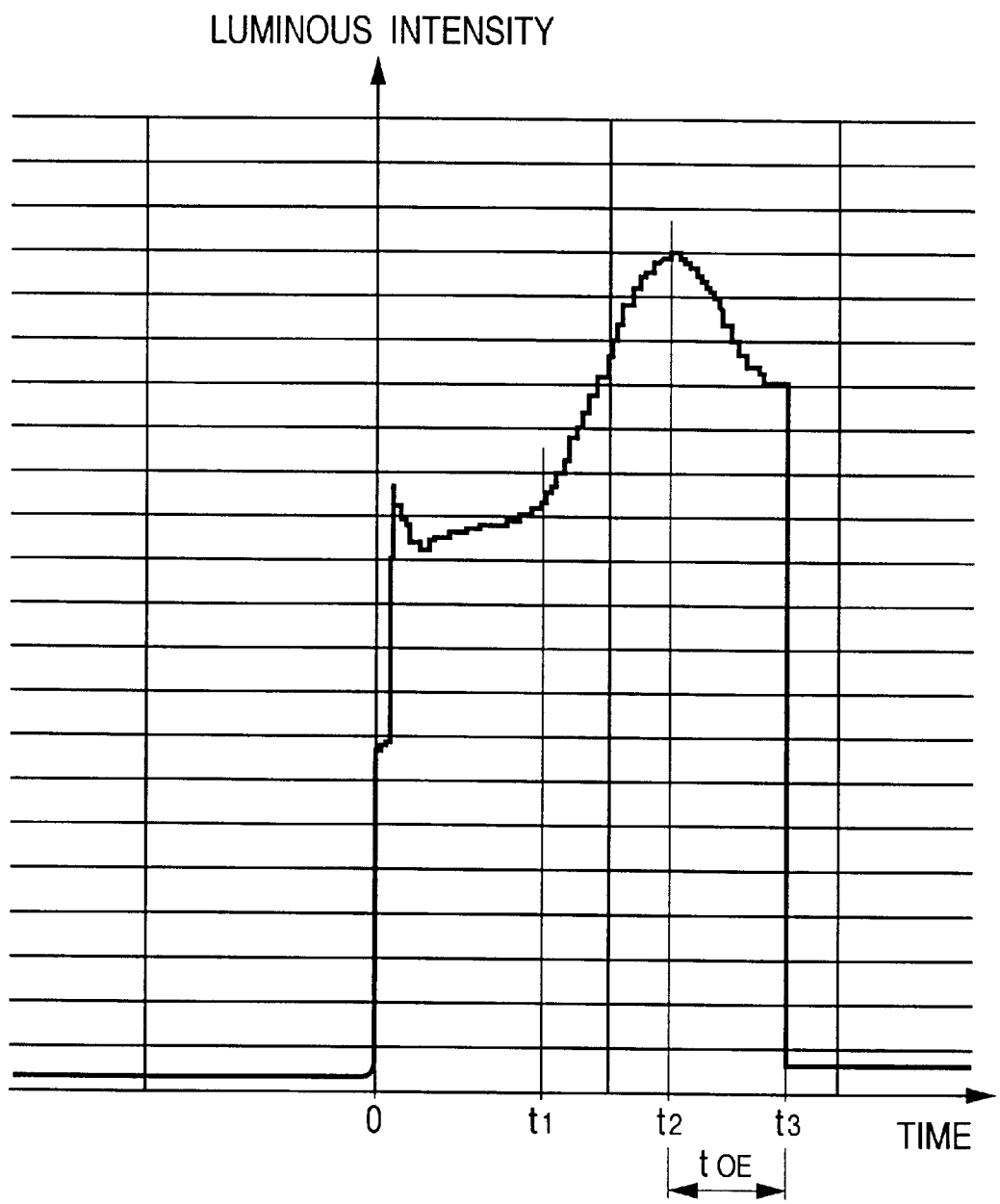
FIG. 31 is a graph showing the change in the luminous intensity of a plasma beam when the PT film on a PZT film is etched.

FIG. 31 is a graph showing the change in the luminous intensity of plasma light when the Pt film 23a (having a thickness of 175 nm) over is the BPSG film 19 is etched. The time period from 0 to $t_1$ on the abscissa is required for the Pt film 23a to be etched; the time period from $t_1$ to $t_2$ is a time period (the just etching time period) required for the underlying barrier metal 22 to be wholly exposed (till the Pt film 23a completely disappears) after the underlying barrier metal 22 starts to be exposed; and the time period from $t_2$ to $t_3$ is required for the overetching treatment. At this time, if the just etching time ($t_2$) of the Pt film 23a is 71 seconds, the overetching time (tOE) is set to 71×0.15=10.6 seconds. In this case, the total etching time ($t_3$) is set to 71+10.6=81.6 seconds.

Figure 32:
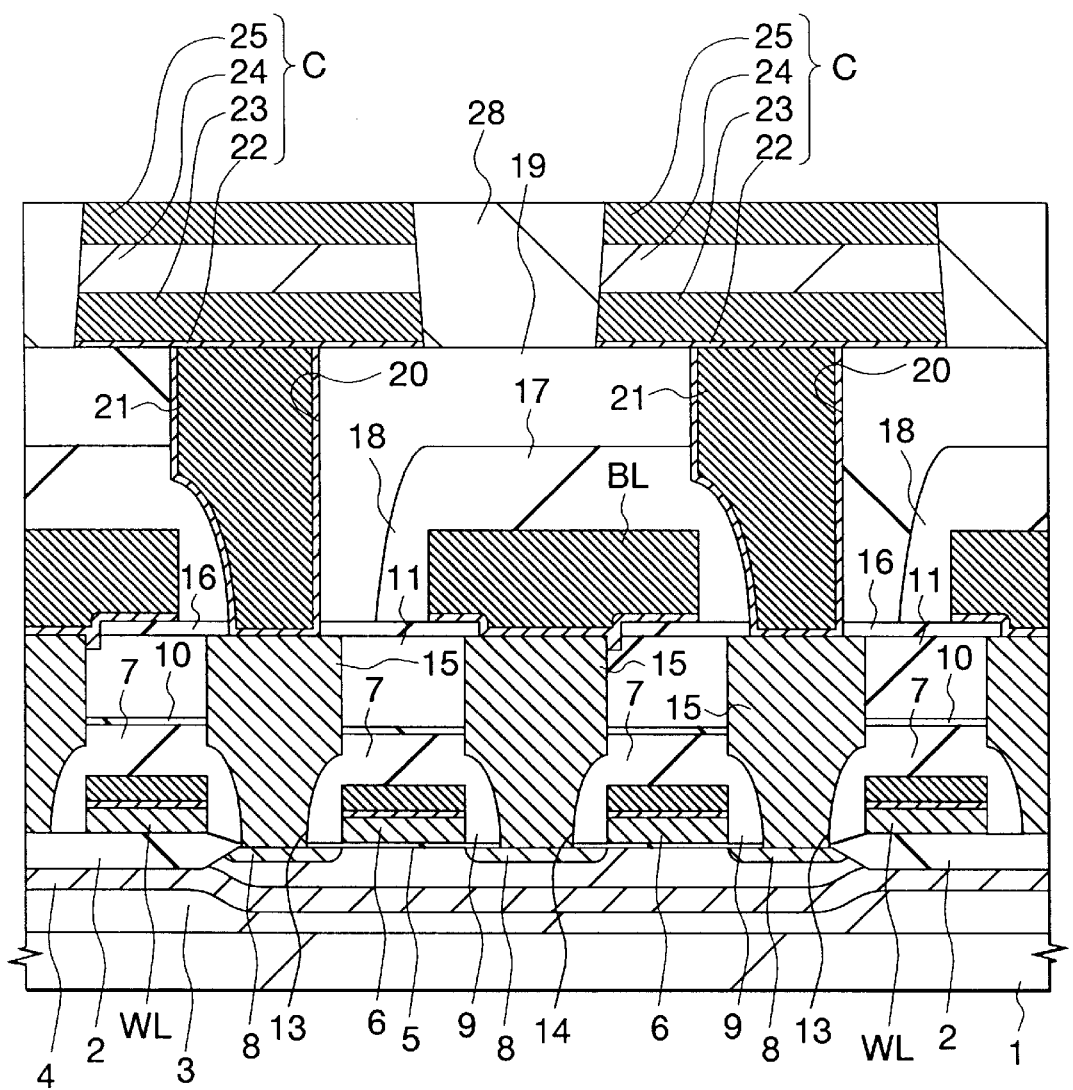
FIG. 32 is a section of an essential portion of a semiconductor substrate and shows a process for manufacturing a DRAM of Embodiment 1 of the present invention.

Next, the resist mask 27, as left over the data storing capacitive element C, is ashed off. After this, as shown in FIG. 32, a BPSG film 28 or a reflow insulating film for protecting the data storing capacitive element C is deposited, and its surface is flattened by the chemical-mechanical polishing (CMP) method to expose the surface of the upper electrode 25 to the outside. In this case, the complete flattening is not essential, but the BPSG film 28 is desirable to be flattened as much as possible for enhancing the reliability of the wiring to be formed thereover at a subsequent step. In order to enhance the effect of protecting the data storing capacitive element C, moreover, a thin film, made of an oxide of Ti, Sr or Ba compatible with the material making the data storing capacitive element C, may be deposited, and the BPSG film 28 may then be deposited. Moreover, this BPSG film may be replaced by a CVD-oxidized silicon film using an organic Si gas or an organic insulator such as a polyimide resin. The CMP method for flattening the insulating film may be replaced by an etching-back method, but this flattening does not need to be performed when the step formed by the data storing capacitive element C is small.

Figure 33:
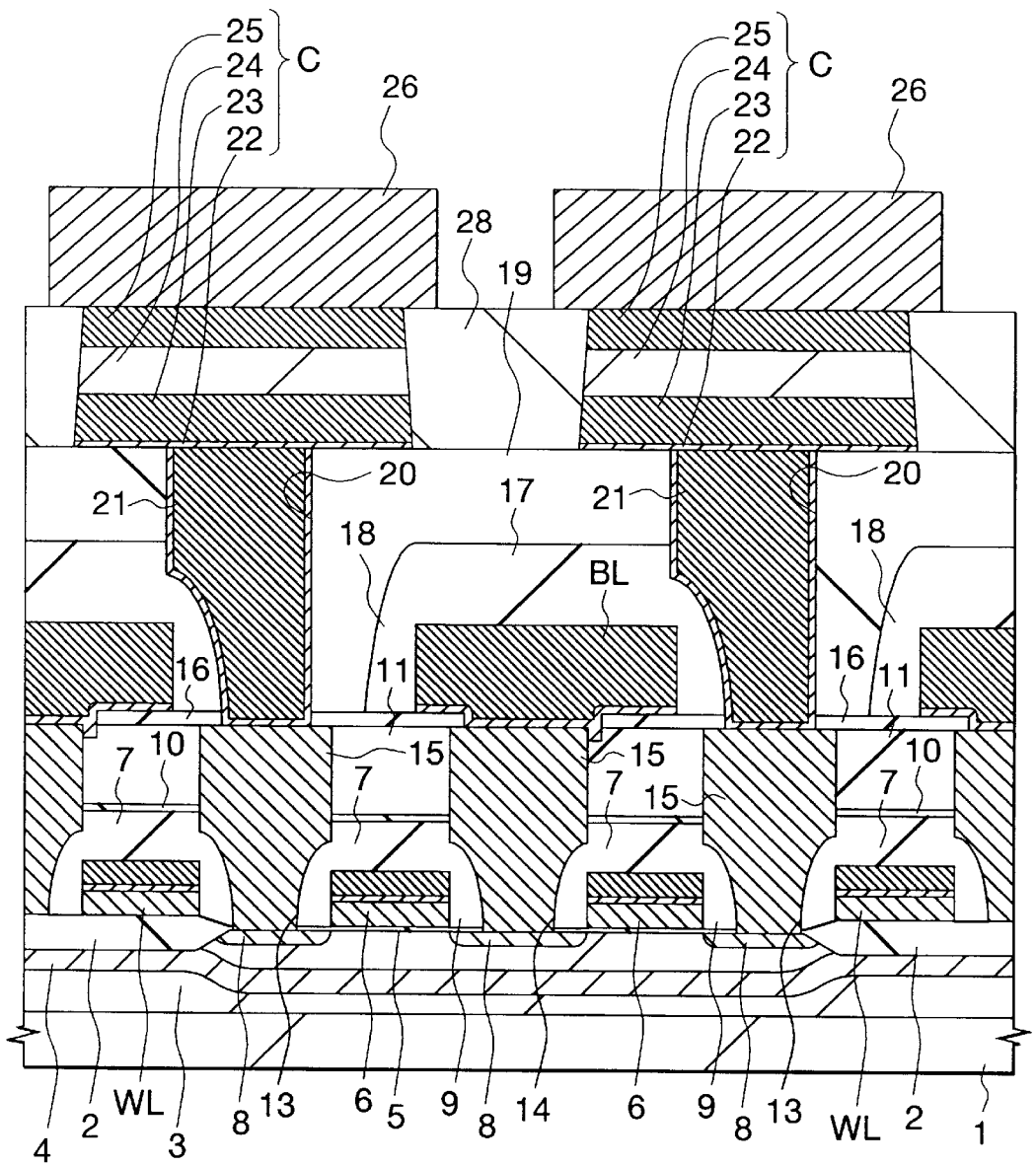
FIG. 33 is a section of an essential portion of a semiconductor substrate and shows a process for manufacturing a DRAM of Embodiment 1 of the present invention.

Next, as shown in FIG. 33, the plate electrode 26, shared among the memory cells, is formed over the BPSG film. The material for the plate electrode can be one of a variety of conducting materials such as a polycrystalline silicon film or a W film to be used in the silicon LSI process of the prior art. A conductive material to be filmed by sputtering is used when the substrate is sufficiently flattened, and a conductive material to be filmed by a CVD method is used when the substrate is stepped.

By the steps thus far described, the memory cells of the DRAM of the present embodiment are substantially completed. It is needless to say that in the actual DRAM it is necessary to form two or more layers of wiring over the plate electrode, to connect the memory cell with the peripheral circuit, and further to package the semiconductor substrate 1 with a resin.

(Embodiment 2)

Figure 34:
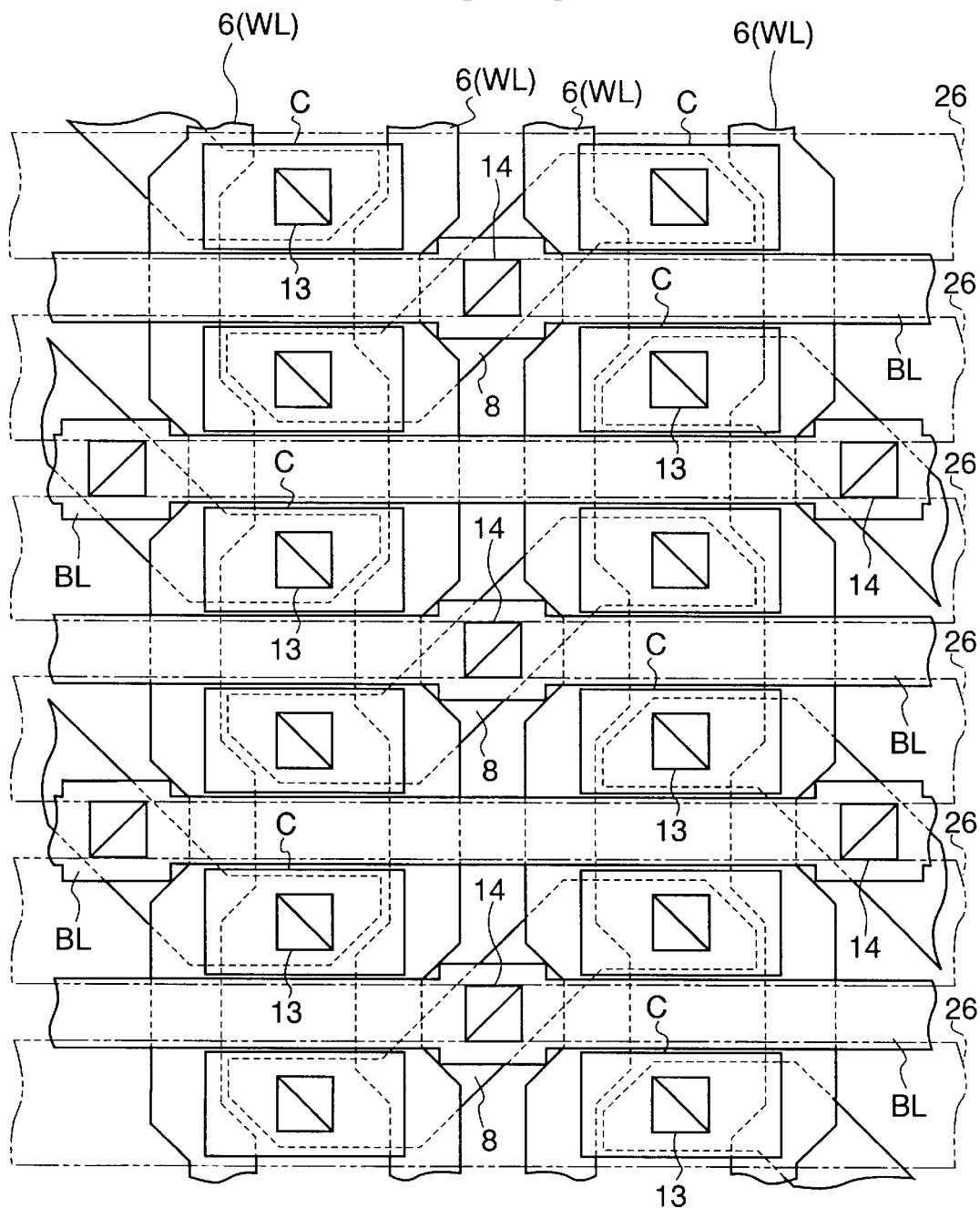
FIG. 34 is a top plan view showing the layout of a DRAM of Embodiment 2 of the present invention.

FIG. 34 is a top plan view showing the layout of memory cells of the DRAM of the present embodiment. The memory cells of this DRAM adopt the two-intersection cells and the COB structure in which data storing capacitive elements are arranged over bit lines. The transistor (the memory cell selecting MISFET) of each memory cell is connected through a bit line BL with a peripheral circuit. The bit line BL is connected through a connection hole 14 with one of semiconductor regions 8 (the source region and the drain region) of the memory cell selecting MISFET. The action of the memory cell selecting MISFET is controlled by a word line WL (a gate electrode 6). This word line WL (the gate electrode 6) is connected with a peripheral circuit. A data storing capacitive element C, arranged over the bit line BL, is connected through a connection hole 13 with the other of the semiconductor regions 8 (the source region and the drain region) of the memory cell selecting MISFET. The data storing capacitive element C is connected with a plate electrode 26 with a peripheral circuit.

This planar layout has a first feature that one plate electrode 26 is arranged for one bit line BL. Thanks to this layout, the capacity of the plate electrode 26 can be made smaller than that in an ordinary DRAM, so that the potential of the plate electrode 26 can be easily controlled by the peripheral circuit. The number of the plate electrode 26 may be one for two or more bit lines BL. When the number of the plate electrode 26 for the number of the bit lines BL decreases, however, the capacity of the plate electrode 26 increases, making it difficult to control the potential by the peripheral circuit. The optimum number of the plate electrodes 26 changes according to the application of the DRAM.

This planar layout has a second feature that the plate electrodes 26 are extended in the same direction as that of the bit lines BL. As a result, the potential of the plate electrodes 26 can be controlled by the peripheral circuit in synchronism with the potential of the bit lines bL.

The memory cells of the DRAM of the present embodiment can be manufactured by a process similar to the aforementioned one of Embodiment 1.

(Embodiment 3)

Figure 35:
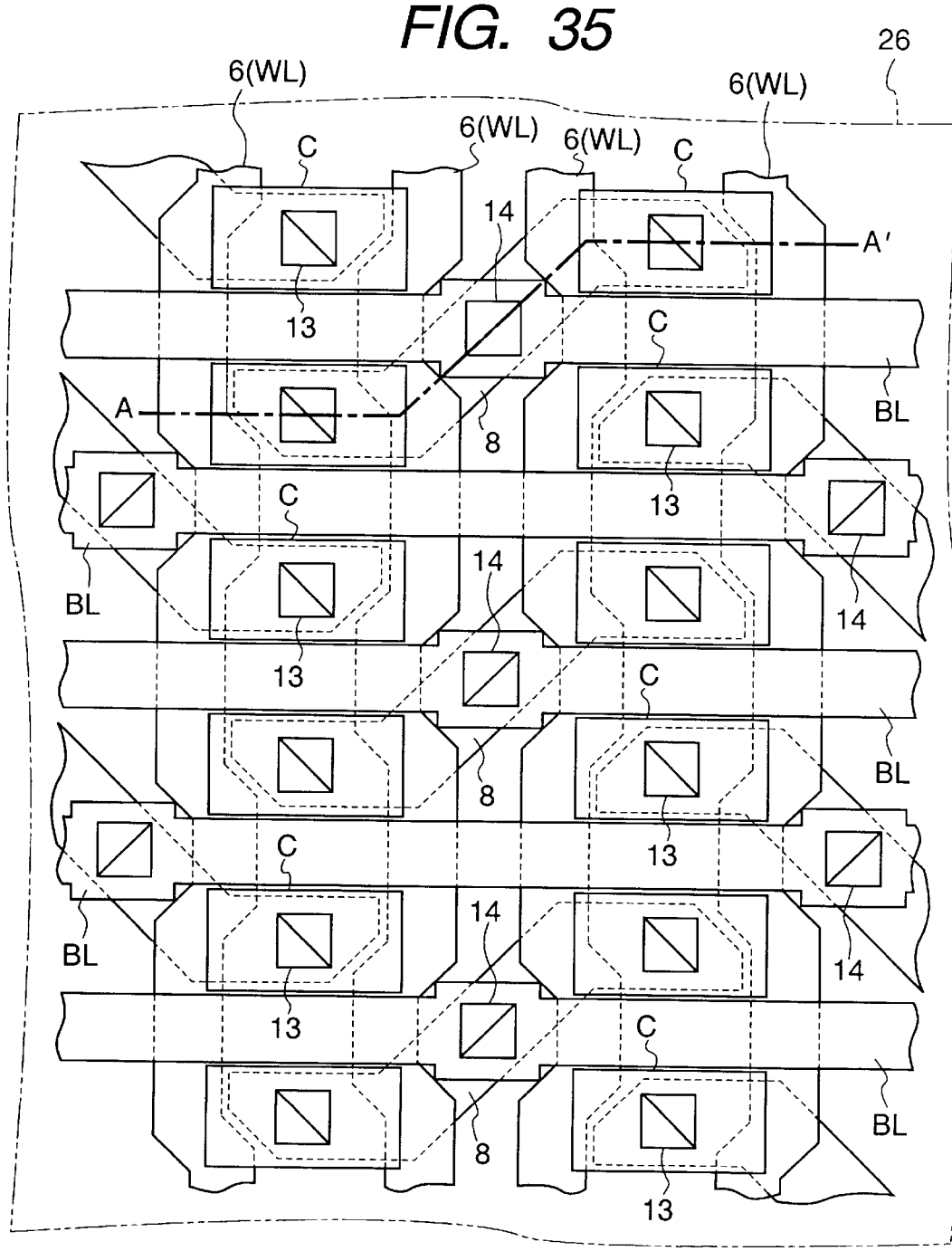
FIG. 35 is a top plan view showing the layout of a DRAM of Embodiment 3 of the present invention.

FIG. 35 is a top plan view showing the layout of the memory cells of a DRAM of the present embodiment.

This top plan layout has a feature that data storing capacitive elements C are controlled by one plate electrode 26 having an enlarged area. Thanks to this layout, the reference potential necessary for the DRAM actions is easily applied to the data storing capacitive elements C. If the drivability of the peripheral circuit is sufficiently enhance, the DRAM can act as a nonvolatile RAM. The number of data storing capacitive elements C to be controlled by the plate electrode 26 may be adjusted according to the application of the memory.

Figure 36:
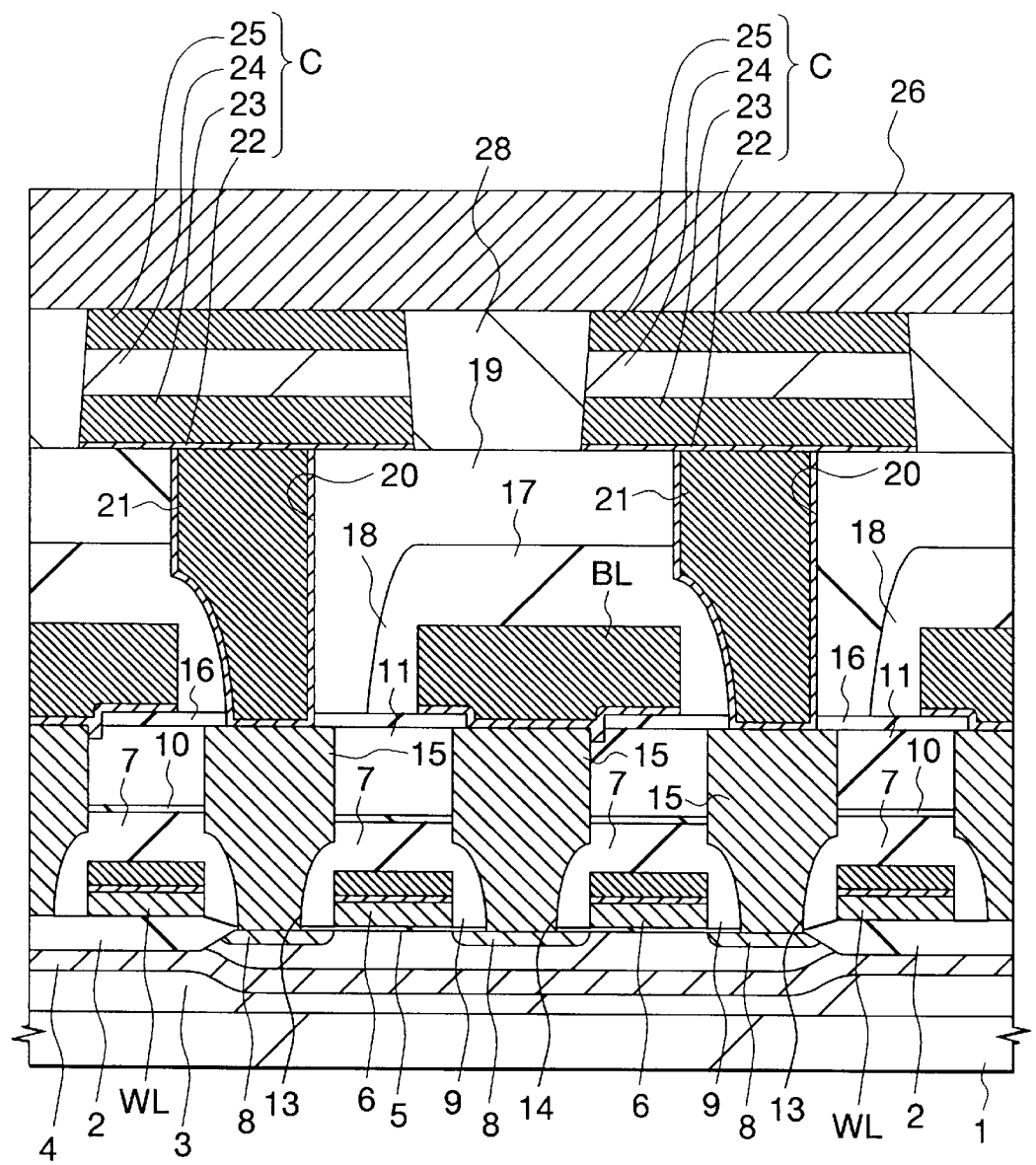
FIG. 36 is a section taken along line A - A' of FIG. 35.

FIG. 36 is a section taken along line A-A' of FIG. 35. The structure and the manufacturing process of the memory cells of the DRAM of the present embodiment are basically identical to those of the memory cells of the DRAM of Embodiment 1 excepting the electrode plate 26. This electrode plate 26 may be worked to a necessary size by a method similar to that of Embodiment 1.

(Embodiment 4)

Figure 37:
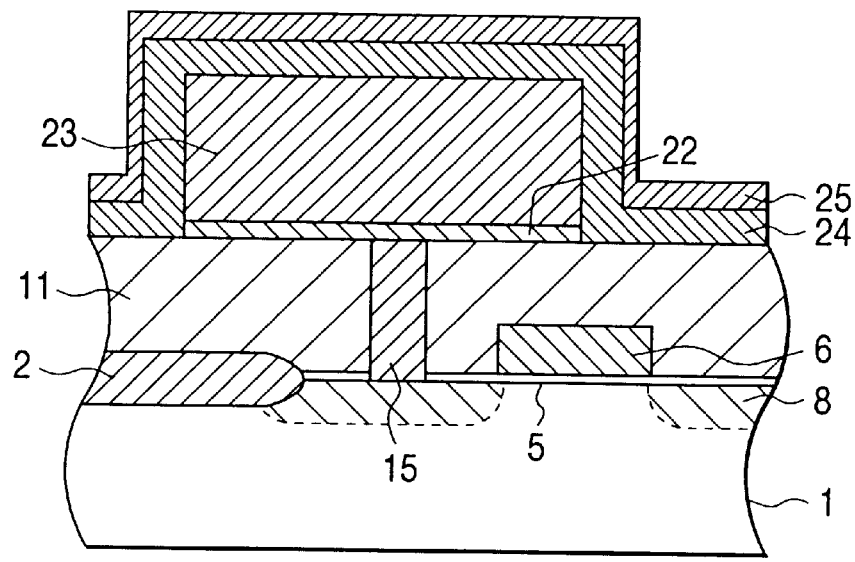
FIG. 37 is a section of an essential portion of a semiconductor substrate and shows a process for manufacturing a memory cell of Embodiment 4 of the present invention.

The structure of memory cells of the present embodiment will be described with reference to FIG. 37. FIG. 37 is a section showing the stage at which the capacitor of a one-transistor/one-capacitor type memory is prepared. A capacitor insulating film 24 of the capacitor is made of PZT or a ferroelectric material, and the lower electrode 23 and the upper electrode 25 of the capacitor are made of Pt.

In this memory, the transistor is electrically isolated by a field oxide film 2 over a semiconductor substrate 1. The transistor is a MISFET which has a semiconductor regions 8 (the source region and the drain region), a gate electrode 6 of polycrystalline silicon, and an underlying gate oxide film 5. The capacitor is formed after the upper portion of the MISFET is flattened with a BPSG film 11. The capacitor and the MISFET are electrically connected through a plug 15 of polycrystalline silicon, which is buried in a portion of the BPSG film 11. The capacitor is a three-dimensional one formed over the lower electrode 23 of Pt by forming the capacitor insulating film 24 of PZT over the lower electrode 23 and by forming the upper electrode 25 of Pt over the capacitor insulating film 24. In order to suppress the diffusion of Pt from the lower electrode 23 into the plug 15, moreover, a barrier metal 22 of TiN is interposed between the lower electrode 23 and the plug 15.

For the actual memory action, what is required in addition to the shown components includes the wiring (two layers of wiring are usually required over the upper electrode 25), and a peripheral circuit for controlling the memory action to exchange signals from the outside, but these components have the known structure but no direct relation to the present embodiment, so that they are omitted.

The capacitor of the present embodiment can also be manufactured by a process similar to the aforementioned one of Embodiment 1.

(Embodiment 5)

Figure 38:
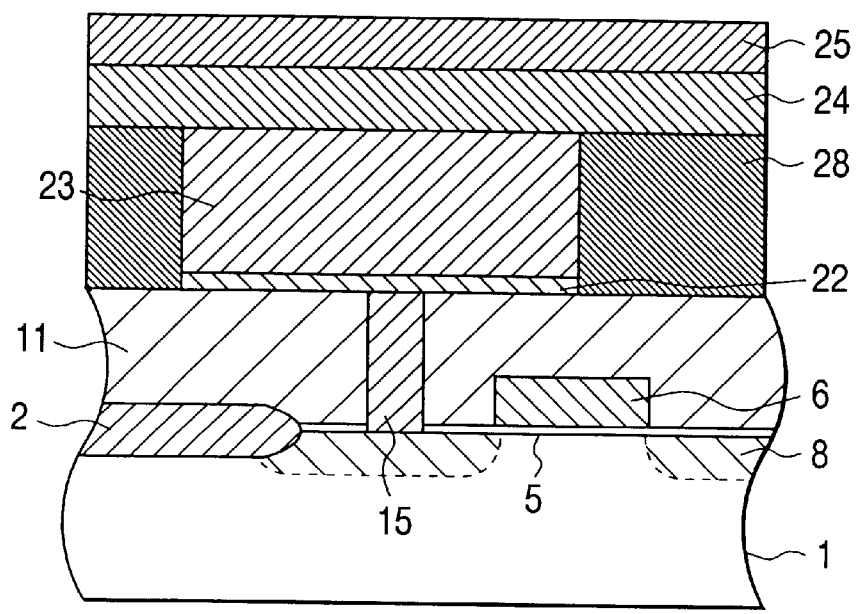
FIG. 38 is a section of an essential portion of a semiconductor substrate and shows a process for manufacturing a memory cell of Embodiment 5 of the present invention.

A process for manufacturing a memory cell of the present embodiment will be described with reference to FIG. 38.

In the present embodiment, a lower electrode 23 is formed, and a BPSG film 28 is then used for the flattening processing. After this, a capacitor insulating film 24 of PZT and an upper electrode 25 of Pt are formed. The remaining steps are identical to those of the manufacture process of Embodiment 4. This three-dimensional capacitor can also be manufactured by the process similar to that of Embodiment 1.

(Embodiment 6)

Both the aforementioned benzophenone novolak resist and non-benzophenone novolak resist can be normally tapered or rounded at its outer periphery of its head by controlling the focusing condition of the exposure beam when they are exposed to the beam. In the present embodiment, the "TSMR9200-B2" (the benzophenone novolak resist) and the "TSMR CR-N2" (the non-benzophenone novolak resist) were used to round the outer peripheries of the heads of their resist patterns by performing the exposure under the following conditions.

The reduction projection aligner was "FPA155OM3" of CANON Inc., and the coater and the developer were "PHOTO MAX 1600" of HITACHI Ltd. The exposures were performed with different focus offsets and under the conditions of a developing time of 60 seconds and a post-exposure baking (P.E.B) of 110° C./120 seconds. After this, the developing agent "NMD-3/2.38%" was used to achieve the results, as tabulated in FIG. 39. Here, the focus offset corresponds to the operation of changing the distance from the focal point if the distance between the lens and the wafer for the best focus is 0. The focus can be changed by its offset to change the sectional shape of the resist.

For the "TSMR9200-B2", as shown, the head of the resist pattern was rounded under any of the focusing conditions, and the root of the resist pattern has an angle near 90 degrees, the shape was best suited for the fine processing, when the focus offset was ±0 to ±1.0 micron. For the "TSMR CR-N2", on the other hand, the head of the resist pattern was rounded when the focus offset was not more than −1.5 microns.

The process described above can be applied to the case in which the head of the resist pattern is to be rounded or normally tapered by using not only the benzophenone novolak resist or the non-benzophenone novolak resist but also a chemically amplified resist (polyhydroxy styrene: PHS) sensitive to the KrF excimer laser light (having a wavelength of 245 nm) or X-rays (having a wavelength of a short wave to about 1 nm) or a resist composed mainly of a fatty ring sensitive to ArF excimer laser light.

(Embodiment 7)

The positive type chemically amplified resist is enabled to round the head of its pattern by using the following process.

Figure 40:
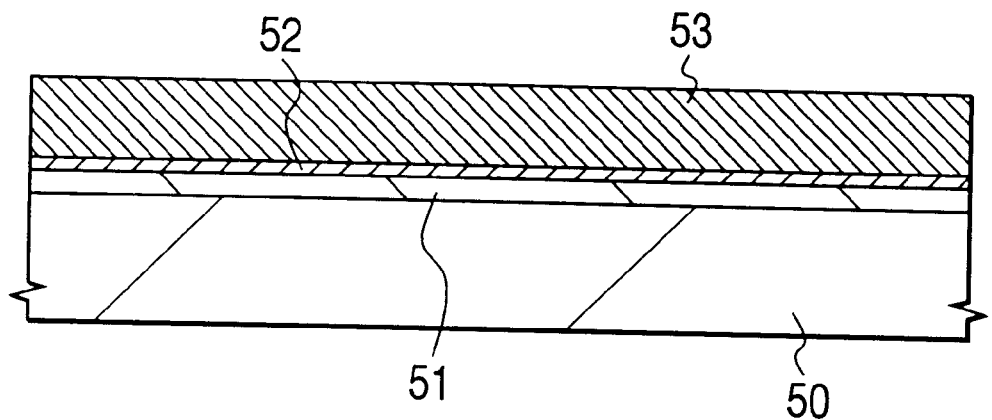
FIG. 40 is a section of an essential portion of a semiconductor substrate and shows a process for forming a resist pattern of Embodiment 7 of the present invention.

First of all, as shown in FIG. 40, a silicon oxide film 51 is formed over a semiconductor substrate 50. After this, a Ti film 52 is deposited thereover as a barrier metal, and a Pt film 53 is further deposited thereover.

Figure 41:
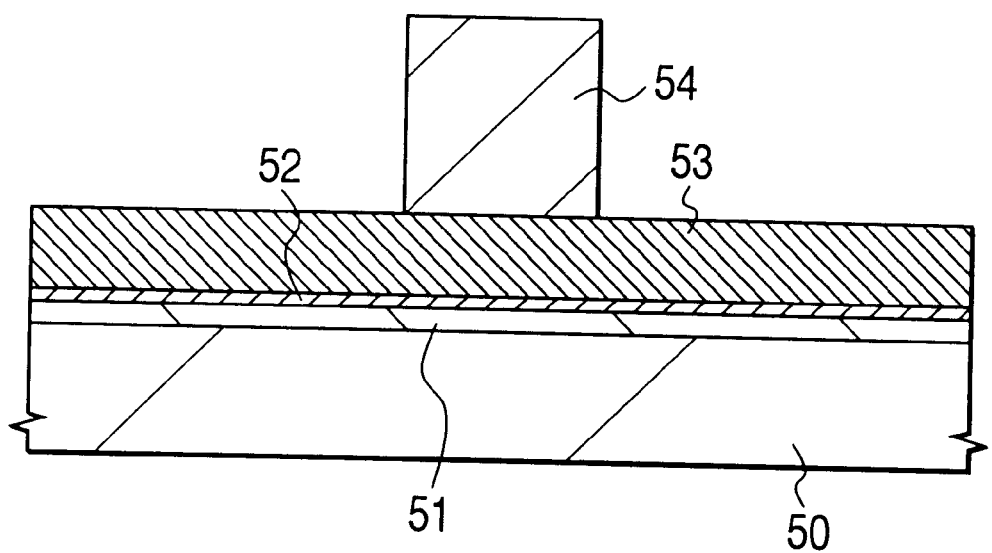
FIG. 41 is a section of an essential portion of a semiconductor substrate and shows a process for forming a resist pattern of Embodiment 7 of the present invention.
Figure 42:
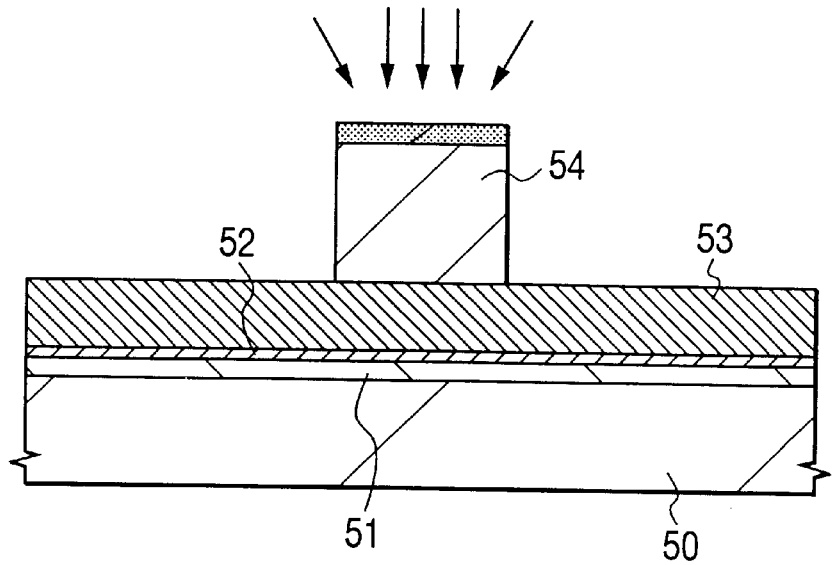
FIG. 42 is a section of an essential portion of a semiconductor substrate and shows a process for forming a resist pattern of Embodiment 7 of the present invention.

Next, as shown in FIG. 41, a positive type chemically amplified resist (e.g., PHS), applied to the Pt film 53 by spin-coating, is exposed and developed to form a resist mask 54 having a generally square periphery at its head.

Next, the resist mask 54 is irradiated with a short-wave beam such as ultraviolet rays (deep UV) having a wavelength of about 200 nm. Then, this ultraviolet radiation is absorbed only by the surface of the resist mask 54, so that only the corresponding region is melted.

Figure 43:
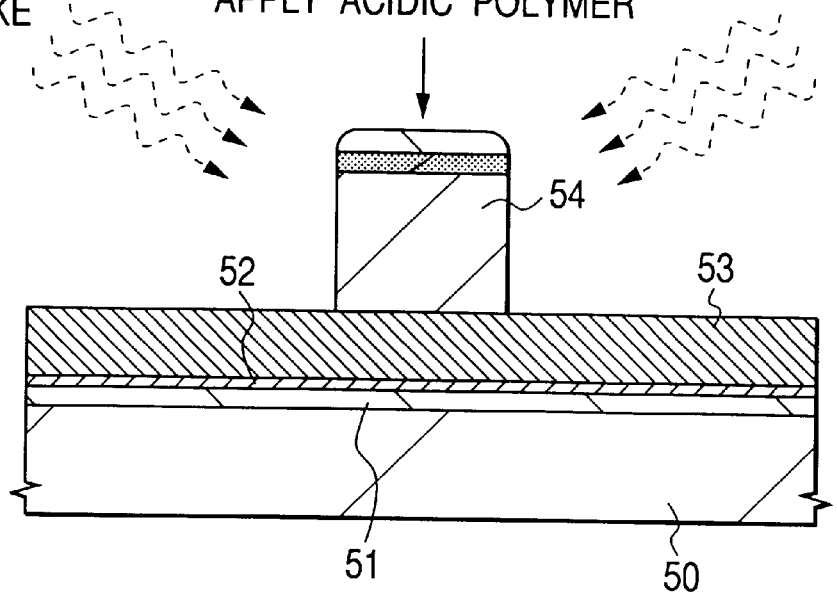
FIG. 43 is a section of an essential portion of a semiconductor substrate and shows a process for forming a resist pattern of Embodiment 7 of the present invention.

Next, as shown in FIG. 43, the surface of the resist mask 54 is coated with an acidic polymer by spin-coating and then the mask 54 is baked to round its head.

In the case of a negative type chemically amplified resist such as a three-component negative type chemically amplified resist made of a novolak resin, an oxide producer and a bridging agent such as hexamethylol melamine, the negative pattern is formed with a developing agent of an aqueous solution of alkali and then exposed to X-rays to round the head of the resist mask.

(Embodiment 8)

The aforementioned novolak resist or chemically amplified resist can be light-etched as a pre-etching after the resist pattern is formed, to normally taper only the head of the pattern.

Figure 44:
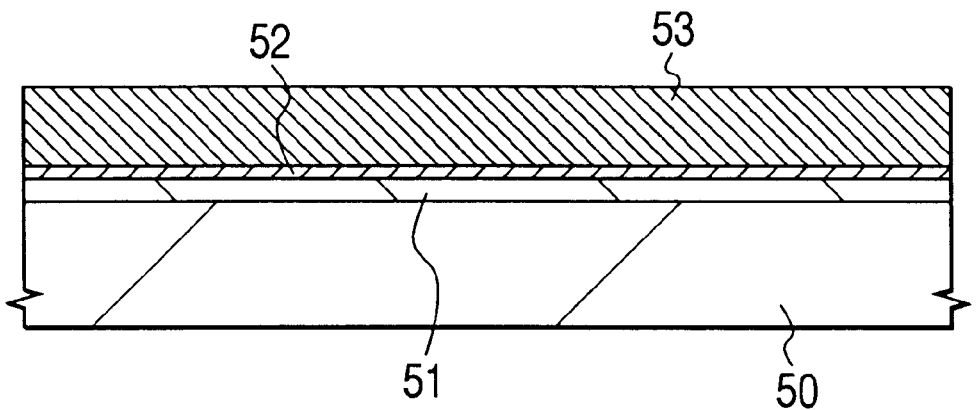
FIG. 44 is a section of an essential portion of a semiconductor substrate and shows a process for forming a resist pattern of Embodiment 8 of the present invention.

In this case, as shown in FIG. 44, a silicon oxide film 51 is formed over a semiconductor substrate 50. After this, a Ti film 52 is deposited as the barrier metal over the silicon oxide film 51, and a Pt film 53 is further deposited thereover.

Figure 45:
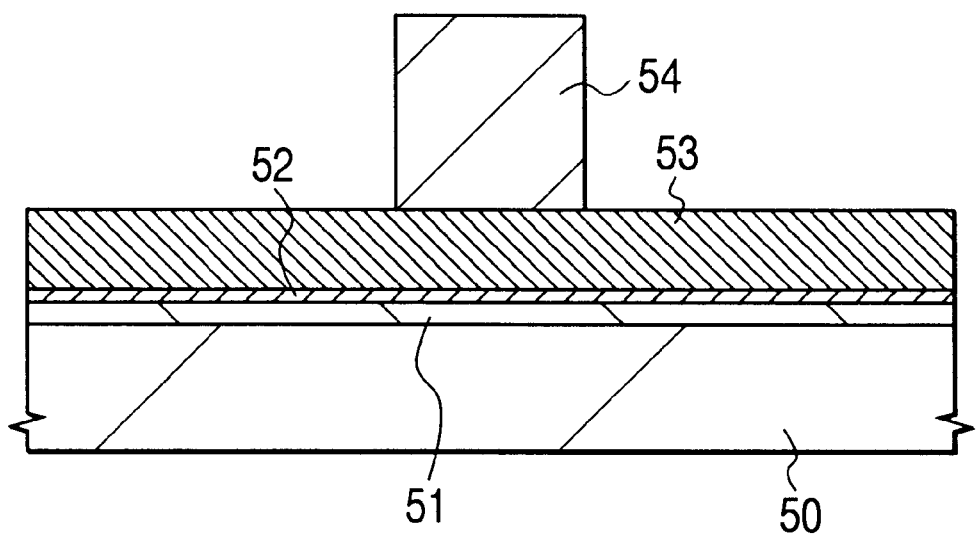
FIG. 45 is a section of an essential portion of a semiconductor substrate and shows a process for forming a resist pattern of Embodiment 8 of the present invention.

Next, as shown in FIG. 45, the Pt film 53 is spin-coated with the non-benzophenone novolak resist and is then subjected to ordinary exposure and development to form a resist mask 54 having a generally square periphery at its head.

Figure 46:
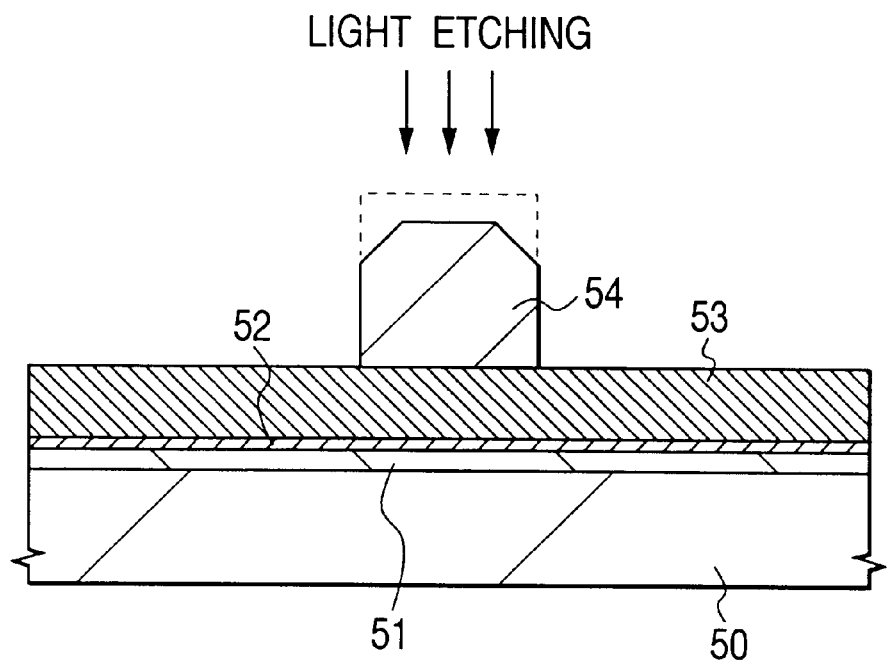
FIG. 46 is a section of an essential portion of a semiconductor substrate and shows a process for forming a resist pattern of Embodiment 8 of the present invention.
Figure 47:
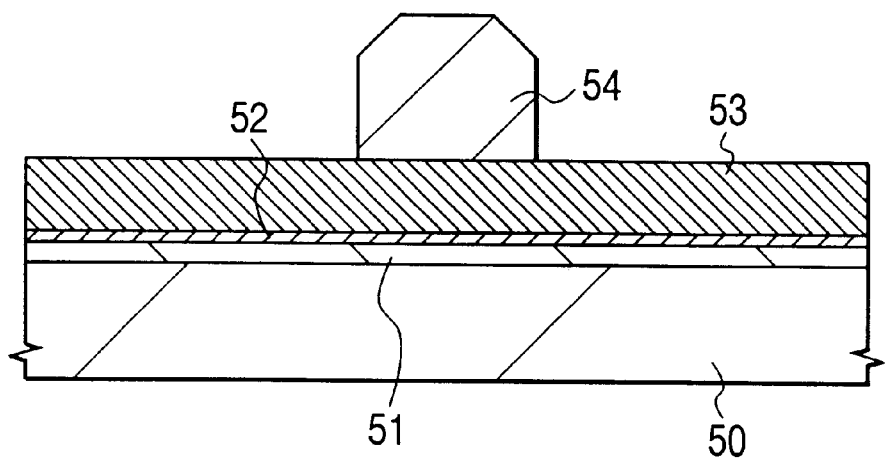
FIG. 47 is a section of an essential portion of a semiconductor substrate and shows a process for forming a resist pattern of Embodiment 8 of the present invention.

Next, as shown in FIG. 46, only the surface of the resist mask 54 is lightly etched prior to the etching of the Pt film 53. The etching apparatus is a RIE etcher, and the etching conditions are as follows: the degree of vacuum in the chamber 30 mTorrs, the RF power 100 W, the $O_2$ (or $CF_4$) gas flow 100 sccm, and the etching time 20 seconds. By this etching of low power, not the Pt film 53 but only the surface of the resist mask 54 is etched, and the etch-off progresses obliquely from the corner of the head of the resist mask 54. By shortening the etching time to about several tens seconds, therefore, only the head of the resist mask 54 can be normally tapered, as shown in FIG. 47. The etching apparatus for this light etching may be any type such as a barrel type etcher if it is a plasma etcher.

(Embodiment 9)

When an ultrafine pattern of no more than 0.2 microns is formed according to the design rule, for example, there are employed either a methacrylate resist, to which a hydrocarbon group having a fatty ring such as adamantane is added for improving the etching resistance, or a resist (such as a chemically amplified resist of the novolak resist or the PHS) for the direct drawing with an electron beam (EB). In the case of the methacrylate resist, a negative type resist can be used to round the head of the resist mask. In the case of the resist for the electron beam, the exposure to the electron beam can be controlled to round the head of the resist mask.

Although our invention has been specifically described in connection with its embodiments, it should not be limited thereto but can naturally be modified in various manners without departing from the gist thereof.

The etching process of the present invention should not be limited to the etching using the magnetron RIE type plasma etching apparatus but can be applied to the etching using a plasma etching apparatus of any type such as an ECR, helicon, ICP or TCP.

The effects to be achieved from a representative one of the invention to be disclosed herein will be briefly described in the following.

According to the manufacture process of the present invention, reaction products having low vapor pressure can be reliably prevented from adhering to the side face of the pattern, when a thin film deposited on the semiconductor substrate is dry-etched, so that the production yield of semiconductor integrated circuit devices can be improved. Moreover, a fine thin film pattern can be formed in a high dimensional accuracy to promote the miniaturization of the semiconductor integrated circuit device.

What is claimed is:

1. A process for manufacturing a semiconductor integrated circuit device, comprising the steps of:

(a) forming a first film, which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) forming a photoresist of a first pattern overlying said first film, the photoresist of a first pattern having, in vertical cross section, a lower side face, an upper side face and an upper surface, the upper side face forming an edge portion with the upper surface, the lower side face being substantially vertical, and the upper side face being either (1) upwardly tapered or (2) rounded at the edge portion; and (c) after said forming the photoresist of the first pattern, patterning said first film by dry-etching, so as to form a first film pattern, by using said photoresist of the first pattern as a mask.

2. A semiconductor integrated circuit device manufacturing process according to claim 1, wherein said first film pattern is overetched, to remove a side wall deposited film which is left on a side face of said first film pattern.

3. A semiconductor integrated circuit device manufacturing process according to claim 1, wherein said layer is a platinum layer.

4. A semiconductor integrated circuit device manufacturing process according to claim 3, wherein said first film includes a layer of a dielectric material, having a specific relative dielectric constant of at least 20, or of a ferroelectric material.

5. A semiconductor integrated circuit device manufacturing process according to claim 1, wherein said first film is formed directly on the first major surface of the wafer.

6. A semiconductor integrated circuit device manufacturing process, comprising the steps of:

(a) forming a first film, which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) providing a positive benzophenone novolak resist film overlying said first film;

(c) forming a first resist film pattern by exposing and developing said positive benzophenone novolak resist film, said first resist film pattern having, in vertical cross section, side and upper surfaces, an edge portion being formed by the side and upper surfaces;

(d) baking said first resist film pattern by irradiating a surface of the first resist film pattern with ultraviolet light;

(e) patterning said first film by dry-etching, to form a first film pattern, by using the baked first resist film pattern as a mask; and (f) overetching said first film pattern, to remove a side wall deposited film which is left on a side face of said first film pattern, wherein insolubilization, in a developer, of an unexposed portion of the first resist film pattern is weakened so that the edge portion of said first resist film pattern will be chamfered or rounded.

7. A semiconductor integrated circuit device manufacturing process according to claim 6, wherein said layer is a platinum layer.

8. A semiconductor integrated circuit device manufacturing process according to claim 7, wherein said first film includes a layer of a dielectric material, having a specific relative dielectric constant of at least 20, or of a ferroelectric material.

9. A process for manufacturing a semiconductor integrated circuit device, comprising the steps of:

(a) forming a first film having a first layer, overlying a first major surface of a wafer;

(b) forming a first photoresist film made of a non-benzophenone novolak resist overlying said first film;

(c) forming a first resist film pattern over said first film by exposing said first photoresist film by reduction projection exposure and subsequently by developing the exposed first photoresist film;

(d) forming a MISFET gate electrode over the first major surface of said wafer by patterning said first film by dry-etching using said first resist film pattern as a mask;

(e) forming a second film having a second layer, overlying the first major surface of said wafer;

(f) providing a second photoresist film made of a benzophenone novolak resist overlying said second film;

(g) forming a second resist film pattern over said second film by exposing said second photoresist film by reduction projection exposure and subsequently by developing the exposed second photoresist film;

(h) patterning said second film, to form a second film pattern, by dry-etching using aid second resist film pattern as a mask; and (i) overetching said second film pattern, to remove a side wall deposited film which is left on a side face of said second film pattern.

10. A semiconductor integrated circuit device manufacturing process according to claim 9, wherein said second film is a film of a capacitor of a memory cell of a DRAM.

11. A semiconductor integrated circuit device manufacturing process according to claim 9, wherein said second film is a film of a capacitor of a memory cell of a ferroelectric RAM.

12. A semiconductor integrated circuit device manufacturing process according to claim 11, wherein said second layer is made of a metal or conductive metal oxides selected from the group consisting of Pt, Ir, $IrO_2$, Rh, $RhO_2$, Os, $OsO_2$, Ru, $RuO_2$ Re, $ReO_3$, Pd and Au.

13. A process for manufacturing a semiconductor integrated circuit device, comprising the steps of:

(a) forming a first film having a first layer, overlying a first major surface of a wafer;

(b) forming a first photoresist film overlying said first film, the first photoresist film having characteristics so as to provide, upon patterning to form a first resist film pattern, a first vertical cross sectional shape having corners at an upper end portion of the first;

(c) forming the first resist film pattern over said first film by exposing said first photoresist film by reduction projection exposure and subsequently by developing the exposed first photoresist film;

(d) forming a MISFET gate electrode over the first major surface of said wafer by patterning said first film by dry-etching using said first resist film pattern as a mask;

(e) forming a second film having a second layer, overlying the first major surface of said wafer formed with said gate electrode;

(f) providing a second photoresist film overlying said second film, said second photoresist film having characteristics so as to provide, upon patterning to form a second resist film pattern, a second vertical cross sectional shape whose corners, at an upper end portion of the second resist film pattern, are less square than those of the first vertical cross sectional shape;

(g) forming the second resist film pattern over said second film by exposing said second photoresist film by reduction projection exposure and subsequently by developing the exposed second photoresist film;

(h) patterning said second film by dry-etching, to form a second film pattern, using said second resist film pattern as a mask; and (i) overetching said second film pattern, to remove a side wall deposited film which is left on a side face of said second film pattern.

14. A process for manufacturing a semiconductor integrated circuit device, comprising the steps of:

(a) forming a first film having a first layer, overlying a first major surface of a wafer;

(b) forming a first photoresist film overlying said first film, the first photoresist film having characteristics so as to provide, upon patterning to form a first resist film pattern, a first vertical cross sectional shape having corners at an upper end;

(c) forming the first resist film pattern over said first film by exposing said first photoresist film by reduction projection exposure and subsequently by developing said exposed first photoresist film;

(d) forming a MISFET gate electrode over the first major surface of said wafer by patterning said first film by dry-etching using said first resist film pattern as a mask;

(e) forming a second film, including a conductive film having a second layer, overlying the first major surface of said wafer formed with said gate electrode;

(f) providing a second photoresist film overlying said second film, said second photoresist film having characteristics so as to provide, upon patterning to form a second resist film pattern, a second vertical cross sectional shape whose corners, at an upper end portion of the second resist film pattern, are less square than those of the first vertical cross sectional shape;

(g) forming the second resist film pattern over said second film by exposing said second photoresist film by reduction projection exposure and subsequently by developing the exposed second photoresist film;

(h) patterning said second film by dry-etching, to form a second film pattern, using said second resist film pattern as a mask; and (i) overetching said second film pattern, to remove a side wall deposited film which is left on a side face of said second film pattern.

15. A process for manufacturing a semiconductor integrated circuit device, comprising the steps of:

(a) forming a film having a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) forming a resist film pattern, which has a substantially vertical side face of its lower half and which is rounded at a peripheral edge portion of a top surface, overlying said first film;

(c) patterning by dry-etching said first film by using said resist film pattern as a mask, so as to form a first film pattern; and (d) overetching said first film pattern, to remove a side wall deposited film which is left on a side face of said first film pattern.

16. A process for manufacturing a semiconductor integrated circuit device, comprising the steps of:

(a) forming a first film having a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) forming a positive resist film pattern having a substantially vertical side face overlying said first film;

(c) upwardly tapering an upper side face portion of said resist film pattern, by baking said resist film pattern;

(d) after the step of upwardly tapering, patterning by dry-etching said first film, to form a first film pattern, by using said baked resist film pattern as a mask; and (e) overetching said first film pattern, to remove a side wall deposited film which is left on a side face of said first film pattern.

17. A semiconductor integrated circuit device manufacturing process according to claim 16, wherein, in the upwardly tapering step, the upper side face portion is upwardly tapered while a lower side face portion of the positive resist film pattern remains substantially vertical.

18. A process for manufacturing a semiconductor integrated circuit device, comprising the steps of:

(a) forming a first film having a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) forming a photoresist film overlying said first film;

(c) forming a first resist film pattern by exposing and developing said photoresist film;

(d) after said step of forming the first resist film pattern, patterning by dry-etching method said first film, to form a first film pattern, using said first resist film pattern as a mask; and (e) overetching said first film pattern, to remove a side wall deposited film which is left on a side face of said first film pattern, wherein a top side wall portion of said first resist film pattern is either (1) upwardly tapered or (2) rounded, by controlling a focusing condition of the exposing beam when exposing said photoresist film.

19. A process for manufacturing a semiconductor integrated circuit device, comprising the steps of:

(a) forming a first film having a first layer, overlying a first major surface of a wafer;

(b) forming a first photoresist film made of a chemically amplified photoresist, overlying said first film;

(c) forming a first resist film pattern over said first film by exposing and developing said first photoresist film, said first resist film pattern having, in vertical cross section, an upper portion having corners;

(d) forming a MISFET gate electrode over the first major surface of said wafer by patterning said first film by dry-etching using said first resist film pattern as a mask;

(e) forming a second film having a second layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying the first major surface of said wafer;

(f) providing a second photoresist film made of a chemically amplified photoresist, overlying said second film;

(g) forming a second resist film pattern having in vertical cross section, an upper portion having corners, the corners of the second resist film pattern being more rounded than the corners of the first resist film pattern, the second resist film pattern being formed over said second film by exposing and developing said second photoresist film; and (h) patterning said second film by dry-etching using said second resist film pattern as a mask.

20. A process for manufacturing a semiconductor integrated circuit device, comprising the steps of:

(a) forming a first film having a first layer, overlying a first major surface of a wafer;

(b) forming a first photoresist film made of a chemically amplified photoresist overlying said first film;

(c) forming a first resist film pattern over said first film by exposing and developing said first photoresist film;

(d) forming a MISFET gate electrode over the first major surface of said wafer by patterning said first film by dry-etching using said first resist film pattern as a mask;

(e) forming a second film having a second layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying the first major surface of said wafer;

(f) providing a second photoresist film made of a chemically amplified photoresist, overlying said second film;

(g) forming a second resist film pattern over said second film by exposing and developing said second photoresist film, the second resist film pattern having, in vertical cross section, an upper surface portion with corners;

(h) melting a surface of said second resist film pattern by irradiating said second resist film pattern with ultraviolet light;

(i) forming a modified second resist film pattern having rounded corners of the upper surface portion by baking said second resist film pattern with an acidic polymer coated over the surface of said second resist film pattern; and (j) patterning said second film by dry-etching using said modified second resist film pattern as a mask.

21. A process for manufacturing a semiconductor integrated circuit device, comprising the steps of:

(a) forming a first film having a first layer, overlying a first major surface of a wafer;

(b) forming a first photoresist film made of a methacrylate photoresist overlying said first film;

(c) forming a first resist film pattern over said first film by exposing and developing said first photoresist film, the first resist film pattern having, in vertical cross section, an upper surface portion having corners;

(d) forming a MISFET gate electrode over the first major surface of said wafer by patterning said first film by dry-etching using said first resist film pattern as a mask;

(e) forming a second film having a second layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying the first major surface of said wafer formed with said gate electrode;

(f) providing a second photoresist film made of a methacrylate photoresist overlying said second film;

(g) forming a second resist film pattern having, in vertical cross section, an upper surface portion having corners, the corners being more rounded than the corners of the upper surface portion of the first resist film pattern, the second resist film pattern being formed over said second film by exposing and developing said second photoresist film; and (h) patterning said second film by dry-etching using said second resist film pattern as a mask.

22. A semiconductor integrated circuit device manufacturing process, comprising the steps of:

(a) forming a first film, which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) providing a photoresist film overlying said first film;

(c) forming a first resist film pattern by exposing and developing said photoresist film;

(d) upwardly tapering a top side wall portion of said first resist film pattern, by performing dry-etching under conditions that said first resist film pattern is slightly etched such that faceting progresses obliquely from a top of said first resist film pattern;

(e) after the step of upwardly tapering, patterning said first film, to form a first film pattern, by dry-etching using said first resist film pattern as a mask; and (f) overetching said first film pattern, to remove a side wall deposited film which is left on a side face of said first film pattern.

23. A semiconductor integrated circuit device manufacturing process according to claim 22, wherein, in the upwardly tapering step, a remaining side wall portion of said first resist film pattern is substantially maintained without being upwardly tapered.

24. A process for manufacturing a semiconductor integrated circuit device, comprising the step of:

patterning by dry-etching a first film which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au overlying a first major surface of a wafer, to form a first film pattern, by using a photoresist film of a first pattern as a mask, which has a substantially vertical lower side face and which has either an upwardly tapered upper side face or has a rounded upper side face.

25. A semiconductor integrated circuit device manufacturing process, comprising the steps of:

(a) forming a first film which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, overlying a first major surface of a wafer;

(b) forming a photoresist of a first pattern, which has a substantially vertical lower side face of its lower half and which has either an upwardly tapered upper side face or has a rounded upper side face, overlying said first film; and (c) after forming the photoresist of the first pattern, patterning by dry-etching said first film, to form a first film pattern, by using said photoresist of the first pattern as a mask.

26. A process for manufacturing a semiconductor integrated circuit device, comprising the steps of:
   (a) forming a first film, which has a layer made of a metal or conductive metal oxide selected from the group consisting of Pt, Ir, $IrO_2$, Rh, $RhO_2$, Os, $OsO_2$, Ru, $RuO_2$, Re, $ReO_3$, Pd and Au, over a first major surface of a wafer;
   (b) forming a patterned photoresist over said first film;
   (c) dry-etching said first film covered with said patterned photoresist to the extent that an upper surface of an underlying film under the first film is exposed; and
   (d) removing a side wall deposited film by overetching the underlying film.

27. A semiconductor integrated circuit device manufacturing process according to claim 26, wherein said layer is a platinum layer.

28. A semiconductor integrated circuit device manufacturing process according to claim 27, wherein said first film includes a layer of a dielectric material having a specific relative dielectric constant of at least 20, or a ferroelectric layer.

29. A process for manufacturing a semiconductor integrated circuit device, comprising:
   (a) forming a patterned photoresist film over a first film, said first film including a layer made of at least one metal or metal oxide selected from the group consisting of Pt, Ir, $IrO_2$, Ru, $RuO_2$, Rh, $RhO_2$, Os, $OsO_2$, Re, $ReO_3$, Pd, and Au, said first film overlying a first major surface of a wafer;
   (b) dry-etching the first film having the patterned photoresist film so as to expose an underlying second film, under conditions that a side wall deposited film is formed over a side wall of the patterned photoresist film; and
   (c) after step (b), performing additional dry-etching so as to remove the side wall deposited film formed over the side wall of a dry-etched pattern including the photoresist film and the first film.

30. A process for manufacturing a semiconductor integrated circuit device according to claim 29, wherein the side wall deposited film is entirely removed through the additional dry-etching.

31. A process for manufacturing a semiconductor integrated circuit device according to claim 29, wherein the patterned photoresist film includes a root portion and a head portion, the root portion being closer to the first film than is the head portion and the head portion forming a top portion of the patterned photoresist film, and wherein said head portion of the patterned photoresist film has a first side wall portion inclined to the extent that no side wall deposited film will be formed thereon, and the root portion of the patterned photoresist film has a second side wall portion more vertical than the first side wall portion to the extent that the side wall deposited film will be formed thereon.

32. A process for manufacturing a semiconductor integrated circuit device according to claim 31, wherein the first and second side wall portions exist when step (b) starts.

33. A process for manufacturing a semiconductor integrated circuit device according to claim 31, wherein the second side wall portion exists at the end of step (b).

34. A process for manufacturing a semiconductor integrated circuit device according to claim 33, wherein the patterned photoresist film is formed from a positive benzophenone novolak resist.

35. A process for manufacturing a semiconductor integrated circuit device according to claim 33, wherein the first film includes a film made of at least one metal or metal oxide selected from the group consisting of Pt, Ir, $IrO_2$, Ru, and $RuO_2$.

36. A process for manufacturing a semiconductor integrated circuit device according to claim 31, wherein the second side wall portion is substantially vertical.

37. A process for manufacturing a semiconductor integrated circuit device according to claim 29, wherein the patterned photoresist film is formed from a positive benzophenone novolak resist.

38. A process for manufacturing a semiconductor integrated circuit device according to claim 29, wherein the patterned photoresist film left after the additional dry-etching is removed after step (c).

39. A process for manufacturing a semiconductor integrated circuit device according to claim 29, wherein the first film includes a film made of at least one metal or metal oxide selected from the group consisting of Pt, Ir, $IrO_2$, Ru, and $RuO_2$.

40. A process for manufacturing a semiconductor integrated circuit device, comprising:
   (a) forming a patterned photoresist film made with a positive benzophenone novolak resist over a first film, said first film including a layer made of at least one metal or metal oxide selected from the group consisting of Pt, Ir, $IrO_2$, Ru, $RuO_2$, Rh, $RhO_2$, Os, $OsO_2$, Re, $ReO_3$, Pd, and Au, said first film overlying a first major surface of a wafer;
   (b) dry-etching the first film having the patterned photoresist film so as to expose an underlying second film; and
   (c) after step (b), performing additional dry-etching so as to remove a side wall deposited film formed over a side wall of a dry-etched pattern including the photoresist film and the first film.

41. A process for manufacturing a semiconductor integrated circuit device according to claim 40, wherein the patterned photoresist film includes a root portion and a head portion, the root portion being closer to the first film than is the head portion and the head portion forming a top portion of the patterned photoresist film, and wherein said head portion of the patterned photoresist film has a side wall portion inclined to the extent that no side wall deposited film will be formed thereon, and the root portion of the patterned photoresist film has a second side wall portion more vertical than the first side wall portion to the extent that the side wall deposited film will be formed thereon.

42. A process for manufacturing a semiconductor integrated circuit device according to claim 41, wherein the first and second side wall portions exist when step (b) starts.

43. A process for manufacturing a semiconductor integrated circuit device according to claim 41, wherein the second side wall portion exists at the end of step (b).

44. A process for manufacturing a semiconductor integrated circuit device, comprising:
   (a) forming a patterned photoresist film over a first film, said first film including a layer made of at least one metal or metal oxide selected from the group consisting of Pt, Ir, $IrO_2$, Ru, $RuO_2$, Rh, $RhO_2$, Os, $OsO_2$, Re, $ReO_3$, Pd, and Au, said first film overlying a first major surface of a wafer;
   (b) dry-etching the first film having the patterned photoresist film so as to expose an underlying second film;
   (c) after step (b), performing additional dry-etching so as to remove a side wall deposited film formed over a side wall of a dry-etched pattern including the photoresist film and the first film; and (d) after step (c), removing the patterned photoresist film left after the additional dry-etching.

45. A process for manufacturing a semiconductor integrated circuit device according to claim 44, wherein the first film includes a layer made of at least one metal or metal oxide selected from the group consisting of Pt, Ir, $IrO_2$, Ru, and $RuO_2$.

46. A process for manufacturing a semiconductor integrated circuit device, comprising:

(a) forming a patterned masking film over a first film, said first film including a layer made of at least one metal or metal oxide selected from the group consisting of Pt, Ir, $IrO_2$, Ru, $RuO_2$, Rh, $RhO_2$, Os, $OsO_2$, Re, $ReO_3$, Pd, and Au, said first film overlying a first major surface of a wafer;

(b) dry-etching the first film having the patterned masking film so as to expose an underlying second film, under conditions that a side wall deposited film is formed over a side wall of the patterned masking film; and (c) after step (b), performing additional dry-etching so as to remove the side wall deposited film formed over the side wall of a dry-etched pattern including the masking film and the first film.

47. A process for manufacturing a semiconductor integrated circuit device according to claim 46, wherein the first film includes a film made of at least one metal or metal oxide selected from the group consisting of Pt, Ir, $IrO_2$, Ru, and $RuO_2$.

48. A process for manufacturing a semiconductor integrated circuit device, comprising:

(a) forming a first patterned photoresist film of a first resist material over a first film, said first film including a layer made of at least one metal or metal oxide selected from the group consisting of Pt, Ir, $IrO_2$, Ru, $RuO_2$, Rh, $RhO_2$, Os, $OsO_2$, Re, $ReO_3$, Pd, and Au, said first film overlying a first major surface of a wafer, the first patterned photoresist film having, in vertical cross section, an upper surface portion including a top side wall;

(b) dry-etching the first film having the first patterned photoresist film so as to expose an underlying second film;

(c) after step (b), performing additional dry-etching so as to remove a side wall deposited film formed over a side wall of a dry-etched pattern of the first film; and (d) prior to step (a), forming a second patterned photoresist film of a second resist material, the second patterned photoresist film having, in vertical cross section, an upper surface portion including a top side wall, the top side wall of the first patterned photoresist film being more rounded than the top side wall of the second patterned photoresist film, the second patterned photoresist film being formed over a third film overlying the major surface of the wafer, and dry-etching the third film using the second patterned photoresist film as a mask, thereby patterning the third film.

49. A process for manufacturing a semiconductor integrated circuit device according to claim 48, wherein steps (a) to (c) constitute patterning steps for making a capacitor of a memory cell.

50. A process for manufacturing a semiconductor integrated circuit device according to claim 49, wherein step (d) constitutes a patterning step for forming a gate electrode, a contact hole, or a through-hole.

51. A process for manufacturing a semiconductor integrated circuit device according to claim 50, wherein the first patterned photoresist film is formed from a positive benzophenone novolak resist.

52. A process for manufacturing a semiconductor integrated circuit device according to claim 51, wherein the second patterned photoresist film has been formed from a positive non-benzophenone novolak resist.

53. A process for manufacturing a semiconductor integrated circuit device, comprising:

(a) forming a patterned photoresist film from a positive benzophenone novolak resist over a first film, the first film including a layer made of at least one dielectric material, having a specific relative dielectric constant of at least 20, selected from the group consisting of BST, PZT, PLT, PLZT, SBT, $PbTiO_3$, $SrTiO_3$, and $BaTiO_3$, the first film overlying a first major surface of a wafer;

(b) dry-etching the first film having the patterned photoresist film so as to expose an underlying second film; and (c) after step (b), performing additional dry-etching so as to remove a side wall deposited film formed over a side wall of a dry-etched pattern including the photoresist film and the first film.

54. A process for manufacturing a semiconductor integrated circuit device, comprising:

(a) forming a patterned masking film over a first film, the first film including a layer made of at least one dielectric material, having a specific relative dielectric constant of at least 20, or ferroelectric material, selected from the group consisting of BST, PZT, PLT, PLZT, SBT, $PbTiO_3$, $SrTiO_3$, and $BaTiO_3$, the first film overlying a first major surface of a wafer;

(b) dry-etching the first film having the patterned masking film so as to expose an underlying second film, under conditions that a side wall deposited film is formed over a side wall of the patterned masking film; and (c) after step (b), performing additional dry-etching so as to remove the side wall deposited film formed over the side wall of a dry-etched pattern including the masking film and the first film.

55. A process for manufacturing a semiconductor integrated circuit device, comprising:

(a) forming a first patterned photoresist film of a first resist material over a first film, the first film including a layer made of at least one dielectric material having a specific relative dielectric constant of at least 20, or ferroelectric material, selected from the group consisting of BST, PZT, PLT, PLZT, SBT, $PbTiO_3$, $SrTiO_3$, and $BaTiO_3$, the first film overlying a first major surface of a wafer;

(b) dry-etching the first film having the first patterned photoresist film so as to expose an underlying second film;

(c) after step (b), performing additional dry-etching to the first film having the first patterned photoresist film so as to remove a side wall deposited film formed over a side wall of a dry-etched pattern of the first film;

(d) prior to step (a), forming a second patterned photoresist film of a second resist material, a top of the first patterned photoresist film being more rounded than a top of the second patterned photoresist film, the second patterned photoresist film being formed over a third film overlying the major surface of the wafer, and dry-etching the third film using the second patterned photoresist film as a mask, thereby patterning the third film.

56. A process for manufacturing a semiconductor integrated circuit device, comprising:

(a) forming a patterned photoresist film over a first film, the first film including a layer made of at least one metal or metal oxide selected from the group consisting of Pt, Ir, IrO$_2$, Ru, RuO$_2$, Rh, RhO$_2$, Os, OsO$_2$, Re, ReO$_3$, Pd, and Au, the first film overlying a first major surface of a wafer; and (b) dry-etching the first film having the patterned photoresist film so as to expose an underlying second film, while forming and removing a side wall deposited film over a side wall of the patterned photoresist film, wherein the patterned photoresist film has a root portion and a head portion, the root portion being closer to the first film than is the head portion, and the head portion forming a top portion of the patterned photoresist film, and wherein said head portion of the patterned photoresist film has a first side wall portion inclined to the extent that no side wall deposited film will be formed thereon, and the root portion of the patterned photoresist film has a second side wall portion more vertical than the first side wall portion to the extent that the side wall deposited film will be formed on the second side wall portion in step (b).

57. A process for manufacturing a semiconductor integrated circuit device according to claim 56, wherein the first film includes a layer made of at least one metal or metal oxide selected from the group consisting of Pt, Ir, IrO$_2$, Ru, and RuO$_2$.

58. A process for manufacturing a semiconductor integrated circuit device, comprising the steps of:

(a) forming a first film having a first layer, overlying a first major surface of a wafer;

(b) forming a first photoresist film made of a non-benzophenone novolak resin overlying said first film;

(c) forming a first resist film pattern over said first film by exposing said first photoresist film by reduction projection exposure and subsequently by developing the exposed first photoresist film;

(d) forming a MISFET gate electrode over the first major surface of said wafer by patterning said first film by dry-etching using said first resist film pattern as a mask;

(e) forming a second film having a second layer, overlying the first major surface of said wafer, which second film forms a capacitor of a memory cell of a ferroelectric RAM, and which second layer is made of a metal or conductive metal oxide selected from the group consisting of Pt, Ir, IrO$_2$, Rh, RhO$_2$, Os, OsO$_2$, Ru, RuO$_2$, Re, ReO$_3$, Pd and Au;

(f) providing a second photoresist film made of a benzophenone novolak resist overlying said second film;

(g) forming a second resist film pattern over said second film by exposing said second photoresist film by reduction projection exposure and subsequently be developing the exposed second photoresist film;

(h) patterning said second film, to form a second film pattern, by dry-etching using said second resist film pattern as a mask; and (i) overetching said second film pattern, to remove a side wall deposited film which is left on a side face of said second film pattern.

59. A semiconductor integrated circuit device manufacturing process according to claim 58, wherein said second film also includes a layer of a ferroelectric substance selected from the group consisting of PZT, PLT, PLZT, SBT, PbTiO$_3$, SrTiO$_3$ and BaTiO$_3$.

60. A process for manufacturing a semiconductor integrated circuit device, comprising the steps of:

(a) forming a first film having a first layer, overlying a first major surface of a wafer;

(b) forming a first photoresist film made of a non-benzophenone novolak resin overlying said first film;

(c) forming a first resist film pattern over said first film by exposing said first photoresist film by reduction projection exposure and subsequently by developing the exposed first photoresist film;

(d) forming a MISFET gate electrode over the first major surface of said wafer by patterning said first film by dry-etching using said first resist film pattern as a mask;

(e) forming a second film having a second layer, overlying the first major surface of said wafer, which second film forms a capacitor of a memory cell of a ferroelectric RAM, and which second layer is made of a metal or conductive metal oxide selected from the group consisting of Pt, Ir, IrO$_2$, Rh, RhO$_2$, Os, OsO$_2$, Ru, RuO$_2$, Re, ReO$_3$, Pd and Au;

(f) providing a second photoresist film made of a benzophenone novolak resist overlying said second film;

(g) forming a second resist film pattern over said second film by exposing said second photoresist film by reduction projection exposure and subsequently by developing the exposed second photoresist film;

(h) patterning said second film, to form a second film pattern, by dry-etching using said second resist film pattern as a mask; and (i) overetching said second film pattern, to remove a side wall deposited film which is left on a side face of said second film pattern.

* * * * *